(12) United States Patent
Yamazaki et al.

(10) Patent No.: US 7,372,073 B2
(45) Date of Patent: May 13, 2008

(54) SEMICONDUCTOR THIN FILM, SEMICONDUCTOR DEVICE AND MANUFACTURING METHOD THEREOF

(75) Inventors: Shunpei Yamazaki, Kanagawa-Ken (JP); Jun Koyama, Kanagawa-Ken (JP); Akiharu Miyanaga, Kanagawa-Ken (JP); Takeshi Fukunaga, Kanagawa-Ken (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 112 days.

(21) Appl. No.: 11/458,412

(22) Filed: Jul. 19, 2006

(65) Prior Publication Data
US 2006/0258069 A1 Nov. 16, 2006

Related U.S. Application Data

(60) Continuation of application No. 09/995,549, filed on Nov. 27, 2001, now Pat. No. 7,091,519, and a continuation of application No. 09/571,500, filed on May 15, 2000, now Pat. No. 6,323,072, and a division of application No. 08/802,276, filed on Feb. 19, 1997, now Pat. No. 6,093,937.

(30) Foreign Application Priority Data

Feb. 23, 1996 (JP) .................... 8-061897
Feb. 23, 1996 (JP) .................... 8-061898

(51) Int. Cl.
*H01L 29/04* (2006.01)
(52) U.S. Cl. ............... 257/49; 257/59; 257/64; 257/70; 257/72
(58) Field of Classification Search ............... 257/49, 257/59, 64, 70, 72
See application file for complete search history.

(56) References Cited

U.S. PATENT DOCUMENTS 4,905,073 A 2/1990 Chen (Continued)

FOREIGN PATENT DOCUMENTS

EP 0 481 777 A2 4/1992

OTHER PUBLICATIONS

Shimokawa, et al.; "Characterization of High—Efficiency Cast-Si Solar Cell Wafers by MBIC Measurement"; Japanese Journal of Applied Physics; vol. 27, No. 5, pp. 751-758 (May 1988).

*Primary Examiner*—Douglas M. Menz
(74) *Attorney, Agent, or Firm*—Fish & Richardson P.C.

(57) ABSTRACT

A semiconductor device includes a substrate having an insulating film on its surface, and ac active layer made of a semiconductive thin film on the substrate surface. The thin film contains a mono-domain region formed of multiple columnar and/or needle-like crystals parallel to the substrate surface without including crystal boundaries therein, allowing the active layer to consist of the mono-domain region only. The insulating film underlying the active layer has a specific surface configuration of an intended pattern in profile, including projections or recesses. To fabricate the active layer, form a silicon oxide film by sputtering on the substrate. Pattern the silicon oxide film providing the surface configuration. Form an amorphous silicon film by low pressure CVD on the silicon oxide film. Retain in the silicon oxide film and/or the amorphous silicon film certain metallic element for acceleration of silicon film to a crystalline silicon film. Then, perform a second heat treatment in the halogen atmosphere forming on the crystalline silicon film a thermal oxide film containing halogen, whereby the crystalline silicon film alters to a mono-domain region.

24 Claims, 18 Drawing Sheets

U.S. PATENT DOCUMENTS

| | | |
|---|---|---|
| 4,975,756 A | 12/1990 | Haken |
| 5,089,862 A | 2/1992 | Warner, Jr. |
| 5,247,198 A | 9/1993 | Homma |
| 5,285,093 A | 2/1994 | Lage |
| 5,321,650 A | 6/1994 | Kikuchi |
| 5,348,903 A | 9/1994 | Pfiester |
| 5,403,772 A | 4/1995 | Zhang |
| 5,426,064 A | 6/1995 | Zhang |
| 5,459,688 A | 10/1995 | Pfiester |
| 5,481,121 A | 1/1996 | Zhang |
| 5,488,000 A | 1/1996 | Zhang |
| 5,492,843 A | 2/1996 | Adachi |
| 5,498,904 A | 3/1996 | Harata et al. |
| 5,501,989 A | 3/1996 | Takayama |
| 5,508,533 A | 4/1996 | Takemura |
| 5,514,880 A | 5/1996 | Nishimura |
| 5,529,937 A | 6/1996 | Zhang |
| 5,534,716 A | 7/1996 | Takemura |
| 5,539,216 A | 7/1996 | Nguyen |
| 5,541,640 A | 7/1996 | Larson |
| 5,543,352 A | 8/1996 | Ohtani |
| 5,550,070 A | 8/1996 | Funai et al. |
| 5,563,426 A | 10/1996 | Zhang |
| 5,569,610 A | 10/1996 | Zhang |
| 5,569,936 A | 10/1996 | Zhang |
| 5,576,556 A | 11/1996 | Takemura |
| 5,580,792 A | 12/1996 | Zhang |
| 5,585,291 A | 12/1996 | Ohtani |
| 5,589,694 A | 12/1996 | Takayama |
| 5,595,923 A | 1/1997 | Zhang |
| 5,595,944 A | 1/1997 | Zhang |
| 5,604,360 A | 2/1997 | Zhang |
| 5,605,846 A | 2/1997 | Ohtani |
| 5,606,179 A | 2/1997 | Yamazaki |
| 5,608,232 A | 3/1997 | Yamazaki |
| 5,612,250 A | 3/1997 | Ohtani |
| 5,614,426 A | 3/1997 | Funada |
| 5,614,733 A | 3/1997 | Zhang |
| 5,616,506 A | 4/1997 | Takemura |
| 5,620,910 A | 4/1997 | Teramoto |
| 5,621,224 A | 4/1997 | Yamazaki |
| 5,624,851 A | 4/1997 | Takayama |
| 5,637,515 A | 6/1997 | Takemura |
| 5,639,698 A | 6/1997 | Yamazaki |
| 5,643,826 A | 7/1997 | Ohtani |
| 5,646,424 A | 7/1997 | Zhang |
| 5,648,277 A | 7/1997 | Zhang |
| 5,654,203 A | 8/1997 | Ohtani |
| 5,656,825 A | 8/1997 | Kusumoto |
| 5,663,077 A | 9/1997 | Adachi |
| 5,677,549 A | 10/1997 | Takayama |
| 5,696,003 A | 12/1997 | Makita |
| 5,696,386 A | 12/1997 | Yamazaki |
| 5,696,388 A | 12/1997 | Funada |
| 5,700,333 A | 12/1997 | Yamazaki |
| 5,705,829 A | 1/1998 | Miyanaga |
| 5,712,191 A | 1/1998 | Nakajima |
| 5,731,978 A | 3/1998 | Tamai |
| 5,744,824 A | 4/1998 | Kousai |
| 5,759,879 A | 6/1998 | Iwasaki |
| 5,818,076 A | 10/1998 | Zhang |
| 5,821,562 A | 10/1998 | Makita |
| 5,849,601 A | 12/1998 | Yamazaki |
| 5,858,823 A | 1/1999 | Yamazaki |
| 5,886,366 A | 3/1999 | Yamazaki |
| 5,893,730 A | 4/1999 | Yamazaki |
| 5,923,962 A | 7/1999 | Ohtani |
| 5,923,968 A | 7/1999 | Yamazaki |
| 5,962,897 A | 10/1999 | Takemura |
| 6,071,764 A | 6/2000 | Zhang et al. |
| 6,077,758 A | 6/2000 | Zhang et al. |
| 6,091,115 A | 7/2000 | Ohtani |
| 6,093,937 A | 7/2000 | Yamazaki |
| 6,122,527 A | 9/2000 | Robinson |
| 6,218,678 B1 | 4/2001 | Zhang |
| 6,285,042 B1 | 9/2001 | Ohtani |
| 6,323,072 B1 | 11/2001 | Yamazaki |
| 6,335,541 B1 | 1/2002 | Ohtani |
| 6,455,401 B1 | 9/2002 | Zhang et al. |
| 6,787,806 B1 | 9/2004 | Yamazaki |
| 6,924,213 B2 | 8/2005 | Zhang et al. |
| 7,056,775 B2 | 6/2006 | Zhang et al. |

FOREIGN PATENT DOCUMENTS

| | | |
|---|---|---|
| EP | 0 651 431 A2 | 5/1995 |
| JP | 02-143417 | 6/1990 |
| JP | 06-132218 | 5/1994 |
| JP | 06 232059 | 8/1994 |
| JP | 06 244103 | 9/1994 |
| JP | 06-333826 | 12/1994 |
| JP | 07-094757 | 4/1995 |
| JP | 07-192998 | 7/1995 |
| JP | 07-288227 | 10/1995 |
| JP | 08-046208 | 2/1996 |
| JP | 08-288515 | 11/1996 |
| KR | 1992-0008930 | 5/1992 |
| KR | 1995-0004453 | 2/1995 |
| KR | 1995-0012580 | 5/1995 |
| KR | 1995-0021777 | 7/1995 |

HEAT TREATMENT IN HALOGEN CONTAINING GAS

REMOVAL OF THERMAL OXIDE

ANNEAL IN A HALOGEN

| ELEMENT | CONCENTRATION (ppm) | ELEMENT | CONCENTRATION (ppm) |
|---|---|---|---|
| Fe | 0.045 | Ca | 0.16 |
| Ni | 0.016 | Mn | <0.001 |
| Na | >0.005 | Al | 0.004 |
| K | >0.004 | U *2 | <0.000031 |
| Ti *1 | <0.05 | Th *2 | <0.00016 |
| Mg | >0.005 | F *3 | 310 |
| Cu | 0.009 | Cl *2 | <0.73 |
| Cr | 0.003 | OH *4 | ND |

MEASURED BY POLARIZATION ZEEMAN FRAMELESS ATOMIC ABSORPTION

*1 ICP LUMINESSANCE ANALYSTS
*2 RADIOCHEMICAL ANALYSIS
*3 EPMA
*4 IR ABSORPTION

FIG. 18

SEMICONDUCTOR THIN FILM, SEMICONDUCTOR DEVICE AND MANUFACTURING METHOD THEREOF

BACKGROUND OF THE INVENTION

1. Field of the Invention

The present invention relates generally to semiconductor devices, and more particularly to semiconductor devices having a semiconductive thin film as its active layer and the manufacturing method thereof. The invention also relates to thin film semiconductor transistors with an active layer made of crystalline silicon films.

2. Description of the Prior Art

In the recent years semiconductor thin-film transistor (TFT) devices are becoming more widely used in the manufacture of electronic parts or components, particularly reduced-thickness display devices and digital integrated circuit (IC) packages, as the speed and cost advantages of these devices increase. As such electronics require higher packing density, higher speed, and lower power dissipation, TFTs become more critical in performance and reliability. Some prior known TFTs come with a silicon thin film as formed on a substrate with a dielectric surface, which film may typically measure several tens to several hundreds nanometers (nm) in thickness.

One typical TFT structure includes an active region as defined between spaced-apart source and drain regions for selective formation of a channel region therein. The active region, namely, the channel formation region and its associated source/drain junction regions may play an important role to determine the performance of TFT as a whole.

This can be said because the resistance of a current path from the source to drain through the channel—i.e., the mobility of minority carriers—can strictly reflect the overall electrical characteristics of TFTs.

Conventionally, amorphous silicon films have been generally employed as the semiconductor thin film constituting the active layer of TFTs. These amorphous silicon films may be fabricated by plasma chemical vapor deposition (CVD) and low pressure thermal CVD techniques.

Unfortunately, the use of such amorphous films is encountered with a problem that where TFTs are required to exhibit higher speeds in operation, amorphous films are incapable of tracing such trend due to its inherently lowered mobility of charge carriers. To this end, silicon thin films with enhanced crystallinity (to be referred to as the "crystalline silicon film" hereinafter) should be required.

One example is that liquid crystal display (LCD) devices of the active-matrix type or passive type come with peripheral circuitry which requires use of driver circuits for driving picture elements or "pixels" each incorporating TFTs, controller circuits for treating image or video signals to be displayed, data storage circuits for storing several kinds of information, and others.

It is especially required that the controllers and storage circuits be equivalent in performance to integrated circuits (ICs) using known single-crystalline silicon wafers. Accordingly, where these circuits are integrated by use of thin film semiconductor as formed on a substrate, it is strictly required to fabricate on the substrate a crystalline silicon film that is identical in crystallinity to the single-crystalline materials.

One prior known approach to form such crystalline silicon film on the substrate has been disclosed, for example, in Published Unexamined Japanese Patent Application (PUJPA) No. 6-232059 to be assigned to the present assignee. In this prior art a chosen metallic element or elements are employed to facilitate or accelerate crystal growth of silicon, which is subject to thermal or heat treatment at a temperature of 550° C. for four hours. With this, resultant crystalline silicon film offers enhanced crystallinity. A similar approach has also been disclosed in PUJPA No. 6-244103.

Unfortunately, even when the above technique is applied to the manufacture of an active layer of TFTs, resultant TFTs for use in processor circuits or memory circuitry remain insufficient in crystallinity. As the semiconductor manufacturers are commercially demanded to improve the TFT speed endlessly, employing the above prior art approach to provide the TFT active layer will be unable to catch up the strict demands due to their inherent limitations as to improvements of the crystallinity.

Especially, in order to achieve the crystalline silicon film having excellent crystallinity identical to that of single-crystalline materials, it should be required that substantially no crystal grain boundaries be present therein. This is because of the fact that the presence or inclusion of such crystal boundaries badly behaves as an energy barrier which can disturb movement or progress of electrons between adjacent crystal grains.

The mechanism of crystal growth by use of the above technique will be analyzed by subdividing the process thereof into four steps in connection with FIGS. 10A to 10F.

See FIG. 10A. A silicon oxide film 11 is formed on the surface of a substrate as a buffer layer. An amorphous silicon film 13 is formed overlying the silicon oxide film 11. Oxide film 11 has a configuration 12 on its surface, which has been formed due to the inherent surface roughness and/or presence of contaminants. The surface configuration 12 is depicted here as local projections for purposes of explanation only. The amorphous silicon film 13 is provided with a few of drops of coating solution containing a metallic element(s) for acceleration or facilitation of crystallization, and then rotated with circular rotational speed sufficient to centrifugally spin the coating solution uniformly and radially across the upper surface of film 13. A coat layer 14 is thus deposited covering the upper surface of amorphous silicon film 13 as shown in FIG. 10A. Coat layer 14 may contain nickel (Ni) as retained therein.

The structure of FIG. 10A is heated up to a temperature of from 500 to 700° C. for crystallization of amorphous silicon film 13. Thus, the metallic element tends to internally diffuse isotropically within amorphous silicon film 13 as designated by arrows shown in FIG. 10B, finally reaching the interface between films 11, 13. This is the first of the prescribed four steps for analysis.

As a result of such internal diffusion, the metallic element migrates through the interface between films 11, 13 leading to segregation on the local projections of surface configuration 12 as shown in FIG. 10C. This is the second step. Such segregation occurs due to the fact that the metallic element attempts in nature to require stable cite of energy—in this case, the surface projections 12 act as such segregation cite.

At this time the surface projections 12 serving as the segregation cite contain one or several metallic elements at an increased concentration permitting occurrence of a crystal nucleus therein. Our study reveals the fact that where the metallic element is nickel, the crystal nucleus takes place when the concentration thereof is equal to or greater than $1\times10^{20}$ atoms per cubic centimeter. Crystal growth occurs with the crystal nucleus being as a starting point or "seed." Such growth begins with vertical crystallization substantially perpendicular to the silicon film surface as shown by numeral 15 in FIG. 10D. This is the third step.

The vertical crystal growth regions 15 of FIG. 10D is such that crystallization progresses while pushing upward the highly condensed metallic element(s) contained therein; accordingly, these elements are forced to reside in the surface of the overlying amorphous silicon film 13 at an increased concentration. This results in that vertical growth regions 15 remain greater in concentration of metallic element than the remaining regions of film 13.

Then, as shown in FIG. 10E, crystal growth starts in a specific direction substantially parallel to the substrate surface (as designated by arrows shown) with a respective interface 16 between the amorphous silicon film 13 and the individual vertical growth region 15 being as a seed of crystallization. This results in lateral growth of crystals 17, which is the fourth step. Each lateral crystal 17 may be a mixture of columnar and/or needle-like crystals having the crystal width which is substantially identical to the thickness of amorphous silicon film 13 as shown in FIG. 10E.

The lateral crystals 17 grow in the direction parallel to the substrate surface in such a manner that laterally growing opposite crystals 17 come closer to each other in one amorphous silicon region as partitioned by adjacent vertical crystal growth regions 15. When these opposite lateral grown crystals 17 are in contact with each other at the front portions thereof, crystal growth is terminated providing a corresponding crystal growth boundary 18 therebetween as shown in FIG. 10F. A resultant lateral crystal growth region 19 with such boundary 18 exhibits relatively regular or well-aligned crystallinity.

One disadvantage faced with the prior art approach to crystallization is that the presence or formation of a number of segregation cites on the film surface acts to increase the density of crystal nucleus, which in turn undesirably causes the individual crystal grain to disturb the growth of neighboring crystals. This should result in a decrease in diameter of crystal grain. In other words, where a crystalline silicon film is formed as the TFT active layer by use of the crystal growth scheme as taught by the prior art, the resulting film must contain crystal boundaries therein. This is a serious bar to achievement of improved crystallinity which is equivalent to that of single-crystalline semiconductor materials.

If the occurrence frequency of such crystal nucleus is decreased, then the crystal grains will increase in diameter accordingly. However, even this is the case, the positional controllability of crystal nucleus remains very difficult or nearly impossible. Generally, the actual location of segregation cites may be determined depending upon where these cites of metallic element are positioned. With the prior art, the segregation cites, such as the local surface projections 12 of FIG. 12A, appear on the film surface at random in position. This means that it remains difficult or almost impossible to well control the exact location of segregation cites. In addition to this, it is shown by the present inventors that any crystalline silicon films fabricated in accordance with the prior art approach discussed previously must contain therein the metallic element that has been utilized during the crystallization process, which disadvantageously serves to deteriorate the stability and reproducibility of semiconductor devices employing the resultant semiconductive film as its active layer or the like.

SUMMARY OF THE INVENTION

It is therefore an object of the present invention to provide a new and improved approach that avoid the problems faced with the prior art.

It is another object of the invention to provide an improved semiconductor device capable of avoiding the problems faced with the prior art as well as the method for forming the same.

It is a still another object of the invention to provide a semiconductor device capable of offering enhanced performance and reliability without having to make use of single-crystalline semiconductor wafers.

It is yet another object of the invention to form a mono-domain region having crystallinity as equivalent to single-crystalline materials on a carrier body with a dielectric surface.

It is a further object of the invention to provide a semiconductor device having an active layer overlying a substrate with a dielectric surface and being made of a mono-domain region as equivalent in crystallinity to single-crystalline materials.

To attain the foregoing objects, in accordance with one aspect of the present invention, a semiconductive thin film is formed on a substrate having an insulating film on a surface thereof, and is comprised of a mono-domain region which includes therein a plurality of columnar and/or needle-like crystals that are substantially parallel to the substrate surface. The insulating film underlying said thin film has a specifically defined surface configuration with an intended profile pattern fabricated.

In accordance with another aspect of the invention, a semiconductor thin film on a substrate having an insulating film on a surface thereof is comprised of a mono-domain region which includes a plurality of columnar or needle-like crystals while substantially excluding presence of crystal grains therein. The insulating film underlying the semiconductive thin film has its surface with a specific configuration with an intended pattern fabricated. The semiconductive thin film constituting the mono-domain region contains therein hydrogen and halogen elements at a carefully determined concentration that is less than or equal to five (5) atomic percent (at %). The halogen element is selected from the group consisting of chlorine, bromine and fluorine.

In accordance with a still another aspect of the invention, the semiconductor device makes use of the mono-domain region exclusively for formation of the active layer thereof. In this case, essentially no crystal grain boundaries exist within the mono-domain region.

In accordance with a further aspect of the invention, a method of forming a semiconductor thin film on a substrate with an insulating film on its surface is provided which method includes the steps of forming a silicon oxide film by sputtering techniques on the insulating film of the substrate, patterning said silicon oxide film to provide an intended pattern of surface configuration thereon, forming an amorphous silicon film by a low pressure chemical vapor deposition on the silicon oxide film, retaining in at least one of the silicon oxide film and the amorphous silicon film a metallic element for facilitation or acceleration of crystallization thereof, performing a first heat treatment to alter in nature the amorphous silicon film to a crystalline silicon film, performing a second heat treatment in an atmosphere containing halogen elements thereby forming on the crystalline silicon film a thermal oxide film containing halogen elements while causing the crystalline silicon film to alter to a mono-domain region due to the second heat treatment, and removing the thermal oxide film. The mono-domain region thus fabricated is for use as the active layer of semiconductor devices.

It should be noted here that the term "mono-domain region" is used to refer to resultant lateral growth crystal region as formed using the semiconductor thin film manufacturing method of the invention, by taking account of the fact that this region is enhanced in crystallinity sufficiently to be regarded as the single crystal in substance. A principal feature of the mono-domain region is that no grain boundaries are found through its entire region, and accordingly, any lattice defects or dislocations are suppressed or eliminated which are otherwise occurred due to presence of transitions and interlayer defects. Another feature is that the mono-domain region avoids inclusion of any metallic elements otherwise acting to badly influence the fundamental characteristics of the semiconductor device.

It should also be noted that the absence of crystal grain boundaries also covers in intended meaning that even if a few grain boundaries are present, these remain electrically inactive. As such electrical inactive grain boundaries, there have been reported the {111} grain boundary, {111} interlayer defect, {221} twin-crystal grain boundary, and {221} twist twin-crystal grain boundary (R. Simokawa and Y. Hayashi, Jpn. J. Appl. Phys., 27 (1987) at pp. 751 to 758).

It is considered by the present inventors that the crystal grain boundaries contained in the mono-domain region remain as electrically inactive ones at increased possibility. In other words, even where some boundaries may be observed therein, such are electrically inactive regions which will no longer reflect or disturb the movement of charge carriers therein. In this sense these are electrically "transparent" to the flow of internal current.

The fabrication of such mono-domain region in accordance with the present invention incorporates a unique concept of precisely controlling the location of crystal nucleus by increasing the diameter of respective crystal grains thereby to decrease in number any possible crystal grain boundaries therein.

The principal approach of the present invention is to extremely smooth the surface of an insulating or dielectric film underlying an amorphous silicon film. To do this, a buffer layer is provided beneath the amorphous silicon film. The buffer layer may be a silicon oxide film as formed by sputtering techniques using an artificial quartz as a target. The composition table of one recommended artificial quartz target used is shown in FIG. 18 for reference. The silicon oxide film thus formed exhibits an enhanced density and increased smoothness, which is free from presence of any possible segregation cites thereon otherwise occurring in the prior art.

Another key concept of the invention is to pattern the silicon oxide film forming thereon a specific surface configuration of an intended profile pattern, which may include a projection or recess in the surface. In other words, intentional formation of segregation cites of certain metallic element for acceleration or facilitation of crystallization makes it possible to well control the actual locations of crystal nucleus that might take place on the film surface. This may enable formation of grown crystals of any desired sizes at any desired locations, and thus provide great contribution to the semiconductor manufacturers.

The use of low pressure chemical vapor deposition (CVD) techniques to form the amorphous silicon film on the substrate is also an important feature of the instant invention. As compared to amorphous silicon films formed using plasma CVD techniques, those formed by the low pressure CVD method offer advantageous characteristics which follow: small in content of hydrogen, more dense in film quality, and less in rate of occurrence of natural crystal nucleus. A decrease in natural nucleus occurrence rate leads to an increase in accuracy of the controllability of crystal nucleus locations.

A further key concept of the invention is that the heat treatments are performed in a specific atmosphere containing therein halogen elements thus enabling fabrication of a mono-domain region. This is based on the present inventors' experimentation and analysis to search for a suitable means for altering the resultant crystals thus grown with relatively large-size crystal grains formed therein to single crystals or equivalents thereto (more precisely, altering to mono-domain regions).

These and other objects, features and advantages of the invention will be apparent from the following more particular description of preferred embodiments of the invention, as illustrated in the accompanying drawings.

BRIEF DESCRIPTION OF THE DRAWINGS

FIG. 18 is a table showing the composition ratio of an artificial quartz target.

DETAILED DESCRIPTION OF THE INVENTION

EXAMPLE 1

A fabrication method of a "mono-domain" region which is a key to the invention will be fully described with reference to FIGS. 1A to 1F. See FIG. 1A. This is a diagrammatic depiction (not drawn to scale) of a substrate 101 having an insulating or dielectric surface. The substrate 101 is made of a material of enhanced heat resistance, such as quartz, silicon or the like. As shown, a silicon oxide film 102 is formed by sputtering techniques on substrate 101 with an artificial quartz being as the target. The silicon oxide film 102 exhibits an increased flatness and smoothness on its top surface; for example, any possible surface configuration of film 102 measures 3 nanometers (nm) or less in height and 10 nm or greater in width. This surface configuration will be difficult or nearly impossible to be visually recognized even by use of atomic force microscopy (AFM) measurement schemes.

Figure 1A:
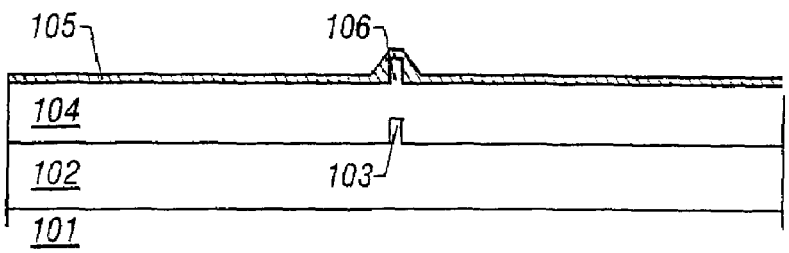
FIGS. 1A to 1F and 2A to 2C illustrate, in schematic cross-section, some of the major steps in the formation of a semiconductor thin-film with mono-domain regions in accordance with one preferred embodiment of the invention.
Figure 1B:
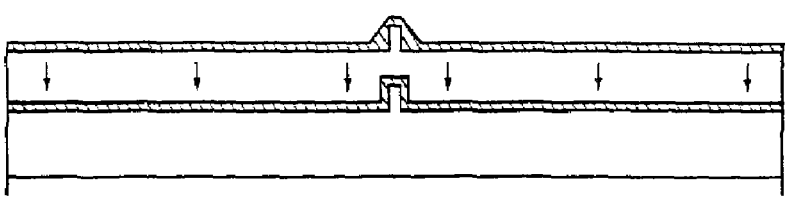

After formation of the extra flat silicon oxide film 102, resultant structure is then subjected to patterning process thereby intentionally forming a minute island pattern of a rectangular or square profile on the top surface of film 102. The island may be a projection 103 as shown in FIG. 1A. This surface island 103 may alternatively be a recess of a corresponding profile in the surface of film 102. Preferably, island 103 is formed such that the height thereof is half the thickness of an overlying amorphous silicon film 104, which is formed by plasma chemical vapor deposition (CVD), sputtering or low pressure CVD techniques to a predetermined thickness of 10 to 75 nm; preferably, 15 to 45 nm. When low pressure CVD techniques are employed, disilane ($Si_2H_6$) or trisilane ($Si_3H_8$) may be used as the film formation gas. Carefully setting the thickness of film 104 to fall within the prescribed range enables fabrication of a semiconductor device using a later-formed crystalline silicon film as its active layer while lowering the turn-off current thereof.

It should be noted that the amorphous silicon film 104 formed using the low pressure CVD method remains less in natural nucleus occurrence rate during a later crystallization step. The term "natural nucleus occurrence rate" refers to the ratio of crystal nucleus which will possibly take place by application of thermal or heat energy without causing amorphous silicon film 104 to accept any influence or interference with certain metallic element such as nickel (Ni) as used to accelerate or facilitate crystallization. Such reduction in natural nucleus occurrence rate is desirable for accomplishment of enlarged crystal grains with an increased diameter. This is as a result of a decrease in mutual interference between respective crystals (that is, a reduction in possibility of termination of crystal growth due to contact or "crash" of neighboring crystals that laterally grow to come closer to each other).

It should also be noted that during formation of the amorphous silicon film 104, great care is taken to maintenance of cleanness on the exposed surface of silicon oxide film 102. As has been discussed in connection with the prior art as shown in the introductory part of the description, if contaminants are present on the film surface, these will badly behave as segregation cites of the crystallization accelerator metal elements providing starting points or "seeds" for undesired growth of crystal nucleus.

After formation of the amorphous silicon film 104, resultant structure is then irradiated with ultra violet (UV) rays in the oxygen-gas atmosphere forming an extra thin oxide film (not shown) on film 104. This oxide film is for improving the wetness of a coating solution as employed to introduce chosen metallic element thereinto. Then, a few drops of solution containing therein certain metallic element(s) acting as a crystallization accelerator are provided on the exposed film surface at a predefined concentration, forming a liquid film (not shown). The metallic element used here may be iron (Fe), cobalt (Co), nickel (Ni), ruthenium (Ru), rhodium (Rh), palladium (Pd), osmium (Os), iridium (Ir), platinum (Pt), copper (Cu) or gold (Au), or a combination thereof. Use of Ni may be recommendable in this case since Ni remarkably exhibits preferable effects for fabrication of an intended mono-domain region as will be described later in the description. Note here that in view of the possibility of residual impurity during later heat treatments, use of nickel nitrate solution is preferable rather than nickel acetate solution due to the fact that the latter inherently contains therein carbon which will undesirably continue by carbonization to reside within a thermal oxide film to be formed by heat treatment as will be discussed later.

The structure of FIG. 1A is then rotated with circular rotational speed sufficient to centrifugally spin the coating solution uniformly and radially across the upper surface of amorphous silicon film 104. A nickel coat solution 105 is thus disposed covering the upper surface of film 104 with the extra thin oxide film (not shown) being laid therebetween. Very importantly, a surface projection 106 is defined on the top surface of amorphous silicon film 104. Projection 106 is essentially self-aligned with and substantially identical in profile to the underlying island 103 positioned just beneath the surface projection 106 as embedded between films 102, 104.

During the spin-coating process, due to the presence of surface projection 106 on the top surface of the structure of FIG. 1A, Ni-coat solution tend to adhere by surface tension to the side walls of projection 106 providing a locally increased concentration of nickel therearound on the surface. This advantageously serves during a later crystallization step to permit acceleration of intended crystal growth, that is, lateral crystallization in parallel to the substrate surface.

While the illustrative embodiment assumes execution of the spin-coating of the solution on amorphous silicon film 104, the same may alternatively be carried out on the silicon oxide buffer layer 102 prior to formation of amorphous silicon film 104. Still alternatively, the coating of such solution may be performed with respect to both films 102, 103 if appropriate.

Then, the structure of FIG. 1A is heated for removal of hydrogen at a temperature of 450° C. in inactive gaseous atmosphere for one hour. Thereafter, the structure is further heated for crystallization of amorphous silicon film 104 at a predetermined temperature ranging from 500 to 700° C., preferably 550 to 600° C., for 4 to 8 hours. This will be called the "first heat treatment" hereinafter.

The crystallization of amorphous silicon film 104 is as follows. As a first step, nickel in amorphous silicon film 104 is thermally activated to isotropically diffuse downward within film 104 as shown by arrows in FIG. 1B.

Figure 1C:
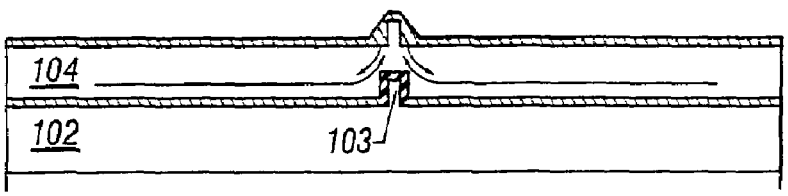

Then, as a second step, the nickel attempts to migrate at the interface between the silicon oxide buffer layer 102 and amorphous silicon film 104 segregating toward island 103. This may function as a segregation cite with the intentionally formed projection profile of island 103 as shown in FIG. 1C.

Figure 1D:
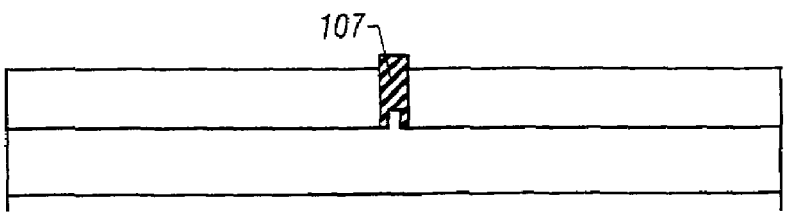

Next, as shown in FIG. 1D, a crystal nucleus takes place at the periphery of segregation cite island 103. This occurs when the nickel concentration becomes equal to or greater than $1 \times 10^{20}$ atoms per cubic centimeter at the periphery of island 103. Creation of such crystal nucleus allows crystal growth or crystallization to progress in a specific direction substantially normal to the silicon film surface. This is the third step of crystallization. A resultant vertical crystal growth region 107 thus formed contains therein nickel at an increased concentration as discussed previously.

Figure 1E:
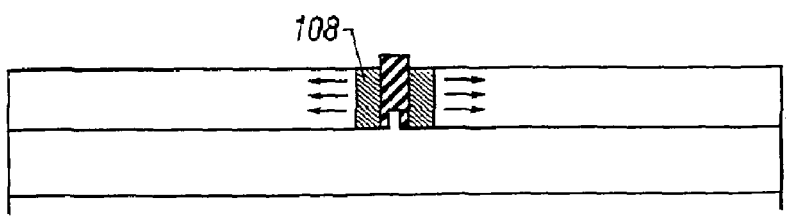

As a fourth step of crystallization, lateral crystal growth occurs with the vertical growth region 107 being as a seed of crystal growth in a direction substantially parallel to the silicon film surface. Lateral crystal growth regions 108 are gradually formed at the opposite sides of region 107 in amorphous silicon film 104 as shown in FIG. 1E. These lateral growth regions 108 are a mixture or combination of a plurality of columnar and/or needle-like crystal segments which are essentially identical or aligned in direction to one another, thus exhibiting superior crystallinity as compared with vertical growth region 107.

During the fourth step, controlling of location of the segregation cite being formed may enable growth of enlarged crystal grains with increased diameter without causing the individual gain to accept unintentional influence or interference with the remaining, adjacent crystal grains. This in turn permits formation of intended crystals of any desired size at any desired locations insofar as design parameters are suitably selected in such a manner that the segregation cite is precisely controlled in location. Note here that how the crystal grains are enlarged in size is determined depending upon how long the heat treatment is to be performed at suitably defined temperatures; accordingly, the actual crystal size may be freely designed in light of the cost limitation in the manufacture of semiconductor devices required. Determination of crystal grain size may also be done by taking into consideration the fact that high-temperature heat treatment will be additionally carried out during a later single-crystallization process which also permits further crystal growth.

As a result of the lateral crystal growth of FIG. 1E, a crystalline silicon film 109 is formed on the silicon oxide buffer layer 102. Here, attention should be paid to the fact that the illustrative fabrication technique differs in principal concept from the presently available graphoepitaxy technology as follows: The graphoepitaxy intends to provide regularity to the surface configuration of an underlying foundation coat film for alignment in distribution of a crystalline silicon film by utilizing its inherent nature that the most stable surface appears at an intended surface location during crystallization of an overlying amorphous silicon film; in contrast, the fabrication method embodying the present invention is featured in varying the surface energy by changing the surface configuration of a coat film providing a specific region which facilitates segregation of the crystallization accelerator metallic element, nickel here. Consequently, the illustrative embodiment remains distinguishable from the graphoepitaxy in that the main reason for a change in surface configuration is to form a crystal nucleus.

Figure 3A:
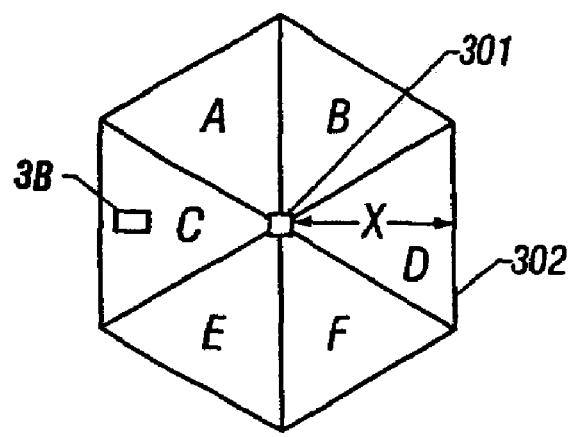
FIGS. 3A to 3C are diagrammatic representations each for explanation of lateral crystal growth regions in a semiconductor device in accordance with the principles of the invention.

A planar view of the crystalline silicon film 109 is depicted in FIG. 3A, wherein numeral 301 designates the vertical crystal growth region (107 in FIG. 1D) as formed at the third step of crystallization. In the illustrative embodiment this region 301 exhibits a square shape due to formation of the minute square island pattern. Numeral 302 denotes the lateral crystal growth region (109 in FIG. 1F) as formed at the fourth step. Lateral growth region 302 has been grown with the centrally located vertical growth region 301 being as a seed or nucleus: In this embodiment, since the seed region 301 can be regarded as a pin point, resultant planar shape resembles a hexagon as a whole as shown in FIG. 3A. One possible reason for such shape is as follows. It has been well known among those skilled in the art that the crystal growth of silicon with a nucleus surrounded by the (111) plane results in crystal grains being grown in hexagonal shape. On the other hand, it is shown by the present inventors that where nickel is employed as one crystallization accelerator metallic element, nickel silicide is formed at the distal end and side portions of each columnar or needle-like crystal during crystallization. It is known that this nickel silicide has its stable plane corresponding to the (111) plane. In view of these facts, the plane surrounding vertical growth seed region 301 is mainly constituted by the (111) plane which is the stable surface of nickel silicide. As a consequence, it will be seen that the lateral growth region 302 of FIG. 3A has a hexagonal shape when crystal growth is done with region 301 being as a starter point under the assumption that region 301 is a point.

As seen from FIG. 3A, the hexagonal lateral growth region 302 may be subdivided into six subregions A to F, each of which can be observed as a single crystal grain. This is because of the fact that dislocations such as slip defects take place at certain locations whereat adjacent ones of subregions A to F are in contact with each other.

Figure 3B:
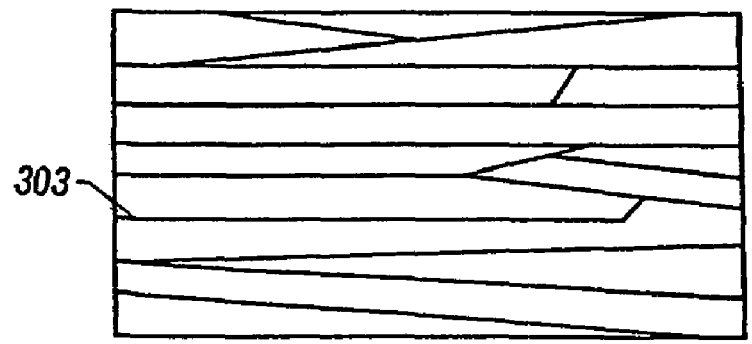

As enlargedly shown in FIG. 3B, one part of lateral growth subregions A to F consists of a mixture of a plurality of minute columnar or needle-like crystals. Macroscopically, the high density or "crowd" of such crystals may allow each subregion to look like a single grain as a whole. Note that a respective one of these columnar or needle-like crystals is a mono-domain region which are free from inclusion or presence of any crystal grain boundaries therein and thus can be deemed to be a single crystal. Note also that since the individual crystal is grown while excluding an impurity such as nickel from the inside thereof, metallic silicide is formed on the surface of each crystal, which in turn results in segregation of nickel at crystal boundaries 303 in FIG. 3B. Accordingly, the crystal state of FIG. 3B remains as a mere collection of multiple mono-domains: While this state exhibits superior crystallinity, it is not attained yet that the individual one of subregions A to F of FIG. 3A is filled with a single mono-domain region.

To fully attain the inventive contribution it should be required a specific process be added for improving the crystallinity of the lateral growth region 302 of FIG. 3B. This process will be referred to as the "single-crystallization" hereinafter, and will be described with reference to FIGS. 2A to 2C. Practically, the single-crystallization may be achieved by heat treatment in the oxidative atmosphere containing halogen elements, which will be called the "second heat treatment" hereinafter.

Figure 1F:
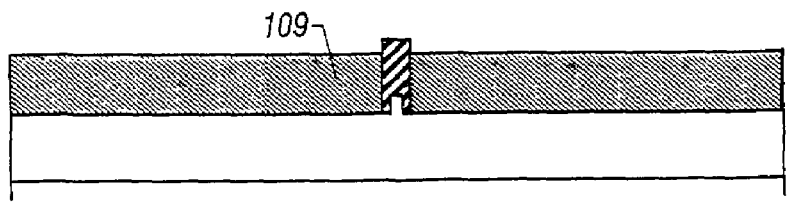

The structure of FIG. 1F including the crystalline silicon film 109 is subjected to a further (second) heat treatment so that the exposed crystalline silicon film 109 is heated at high temperatures which range from 700 to 1100° C. for 1 to 24 hours. Preferably, the film 109 is heated at 800 to 1000° C. for 6 to 12 hours. Very importantly, the atmosphere employed here is designed to contain therein halogen elements at the step of FIG. 2A. In this embodiment, the second heat treatment was performed at a temperature of 950° C. for 6 hours in a chosen atmosphere of oxygen gas that contains therein HCl at concentration ratio (volume density) of 3%. Note here that further inclusion of nitride gas in the atmosphere may be recommendable for achievement of sufficient getter effects since it acts to slow the rate of formation of any oxide films. Note also that while Cl was chosen as the halogen element in this embodiment with HCl gas being employed as an introduction material thereof, other kinds of gases may alternatively be used. HF, $NF_3$, HBr, $Cl_2$, $F_2$ and/or $Br_2$ are examples thereof. Halogen hydrates or organic substances (carbohydrates) are other possible examples.

Figure 2A:
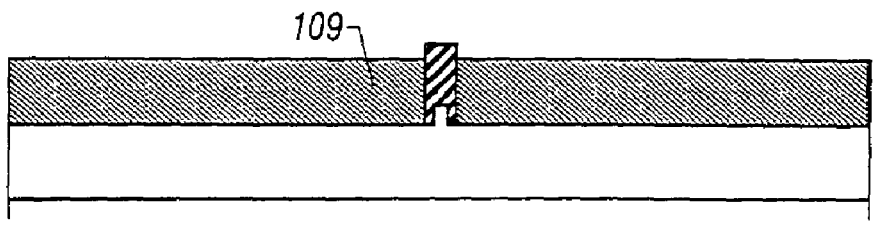

During the second heat process at step of FIG. 2A, the nickel in the crystalline silicon film 109 heated is gettered due to the chlorine's action, and thus is removed away as a result of absorption into an overlying thermal oxide film 110 and/or release toward the atmospheric air. Accordingly, nearly all Ni elements contained are removed from film 109 providing a Ni-absent crystalline silicon film 111 covered by the thermal oxide film 110 as shown in FIG. 2B.

Figure 2B:
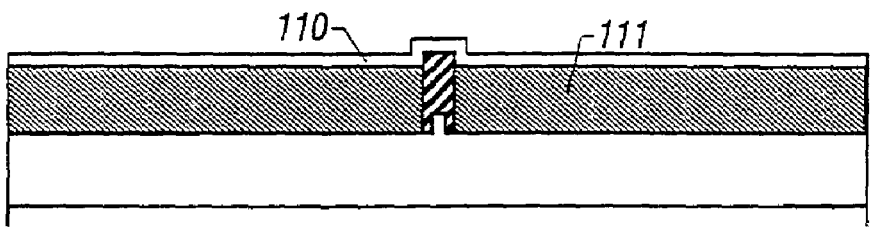

The nickel (Ni) removed during the getter step of FIG. 2B has been segregated as a result of push-out toward crystal boundaries (see 304 in FIG. 3B) during crystallization. It can thus be considered that Ni has been present as nickel silicide at the crystal boundaries. The nickel silicide is separated as nickel chloride resulting in presence of a number of unpaired coupling hands of silicon after separation or cutoff from nickel atoms at grain boundaries therein. Fortunately, several unpaired coupling hands of silicon atoms are forced during the second heat treatment at 950° C. to mutually recombine with those of the remaining ones. Still unpaired hands, if any, are filled with those of hydrogen and halogen elements as also contained in the crystalline silicon film 111. Due to this, film 111 comes to contain hydrogen and halogen elements at 5 atomic percent (at %) or less. This ensures that the boundaries are in junction with one another with an enhanced matching property due to such recombination of silicon atoms, enabling exclusion or depletion of any boundaries therein. Furthermore, as a result of the second heat treatment, transitions, dislocations or any other possible interlayer crystal defects inside the columnar and needle-like crystals will disappear almost completely enhancing the crystallinity of them.

The improvement in crystallinity will be more fully described with reference to FIGS. 3B and 3C for comparison. By heating the crystal structure of the lateral crystal growth region shown in FIG. 3B, nickel contained therein is removed away from the film by chlorine's getter action. When this is done, the coupling or combination between silicon and nickel atoms is cut off forming unpaired coupling hands, which are then recombined with those of neighboring silicon atoms during the heat treatment to provide a resultant crystal structure as shown in FIG. 3C.

Figure 3C:
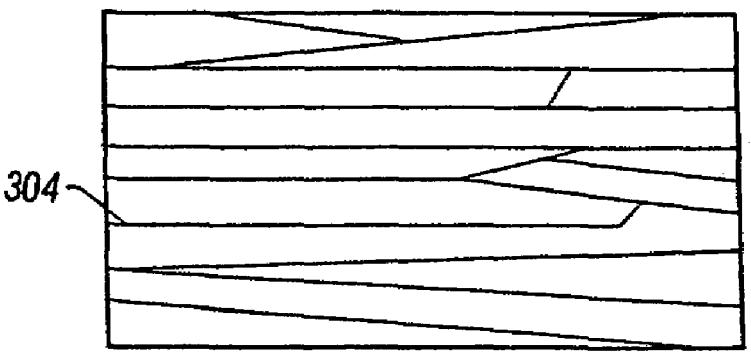

The structure of FIG. 3C comes with several junction interfaces as designated by broken lines 304. These interfaces 304 have been formed as a result of the crystal boundaries 303 of FIG. 3B being once dissociated due to the heat treatment and then recombined thereafter. In each of the crystal segments A to F of FIG. 3A, the columnar or needle-like crystals therein are recombined together with superior matching or alignment providing the state of FIG. 3C which is nearly perfectly free from inclusion of any crystal boundaries. This ensures that each of subregions A to F of FIG. 3A contains no substantive boundaries and no impurity atoms such as nickel and that each segment behaves as a mono-domain region which may eliminate presence of any possible crystal defects therein Our experimentation using secondary ion mass spectrometer (SIMS) analysis revealed the fact that the mono-domain region was reduced in Ni concentration by one to three orders of magnitude.

Turning back to FIG. 2C, after completion of the nickel getter process, the thermal oxide film 110 of FIG. 2B is then removed away, which has functioned as the gettering cite. Removal of film 110 is to prevent nickel atoms from re-diffusing into the crystalline silicon film 111. In this way there is obtained the crystalline silicon film 111 with a reduced nickel concentration as shown. In this region Ni has been removed or decreased, by execution of the heat treatment in the halogen atmosphere, down at a target concentration which is low sufficient to ensure that residual Ni atoms if any do no longer disturb the manufacture or fabrication of intended semiconductor devices including TFTs—for example, $1 \times 10^{18}$ atoms per cubic centimeter (atoms/$cm^3$) or less; preferably, $1 \times 10^{17}$ atoms/$cm^3$; more preferably, $1 \times 10^{16}$ atoms/$cm^3$. This in turn leads to an improvement in crystallinity to the extent that the mono-domain region can be equivalent in crystal structure to single-crystalline materials.

One characterizing feature of the invention is that the mono-domain region thus formed is for exclusive use as the active layer of semiconductor devices, including TFTs.

Figure 11:
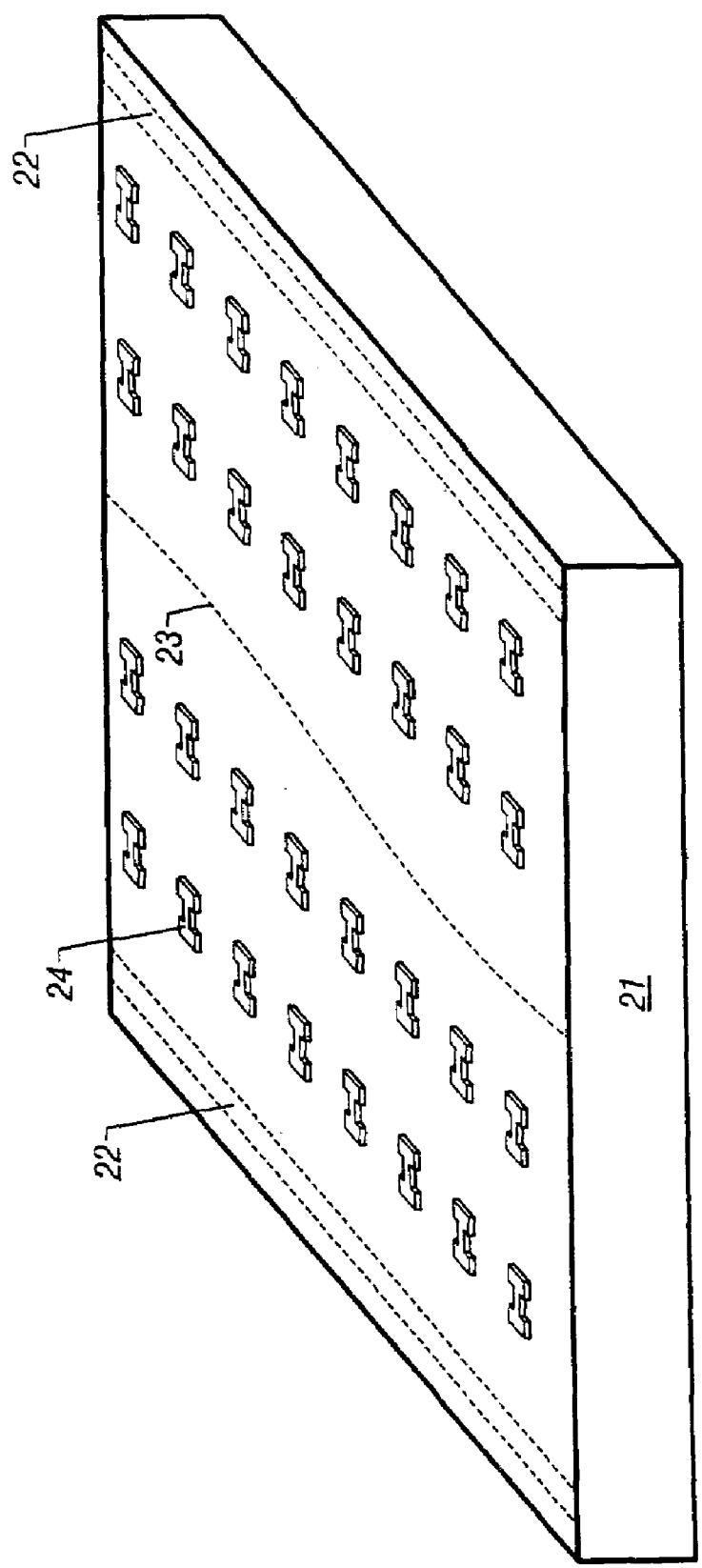
FIG. 11 is a perspective view of a liquid crystal display (LCD) substrate having multiple patterned TFT active layers as formed in a mono-domain region in accordance with a further embodiment of the invention.

A semiconductor structure is shown in FIG. 11, which is for use in an active-matrix liquid crystal display (LCD) device with TFTs each having an active layer consisting of the mono-domain region of the present invention. As shown, the structure includes a substrate 21 having an insulating or dielectric surface on which an array of patterned TFT active layers 24 are disposed in rows and columns. Two stripe-shaped elongate surface areas 22 at the opposite side edges of substrate 21 are certain locations where the vertical crystal growth regions have been positioned. A broken line 23 is depicted to show the locus of a linear crystal grain boundary which has been formed here due to mutual conflict of lateral growth regions. The broken line is used here because such boundary 23 successfully disappears once after completion of fabrication of patterned active layers 24.

As shown in FIG. 11, the array of active layers 24 is centrally formed on the top surface of substrate 21 while avoiding inclusion of the vertical growth region presence areas 22 and the locus of boundary 23. While the explanation is directed to part of LCD structure illustrated, the above is also true for the remaining ones (not visible in the drawing) of TFT active layers which will be provided on the order of $10^6$ in number on substrate 21.

EXAMPLE 2

A manufacturing method of a TFT structure utilizing the mono-domain of Example 1 is shown in FIGS. 4A to 4E. While this illustrative embodiment will be described herein in connection with a top-gate TFT structure, the invention should not exclusively be limited thereto. One skilled in the art will readily recognize that the method of FIGS. 4A to 4E may alternatively be applicable to formation of a bottom-gate TFT with the gate electrode being replaced by the one which is high in heat resistance.

Figure 4A:
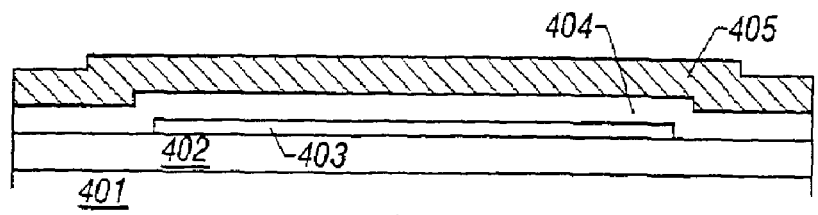
FIGS. 4A to 4E illustrate, in schematic cross-section, some of the major steps in the formation of a semiconductor device having a mono-domain active layer in accordance with another embodiment of the invention.

As shown in FIG. 4A, a quartz substrate 401 with a silicon oxide film 402 and a "pseudo single-crystalline" mono-domain silicon film 403 being laminated on the surface of substrate 401 in this order. Note that the films 402, 403 may be fabricated using the method shown in FIGS. 1A-1F and 2A-2C. The silicon film 303 has therein a mono-domain region as described previously. Film 403 is patterned by patterning techniques as shown in FIG. 4A. This patterned film 403 will be later used as the active layer of a TFT structure.

In the structure of FIG. 4A, another silicon oxide film 404 is deposited by plasma CVD techniques to a predetermined thickness, for example, 150 nm. This film 404 will later act as the gate insulating film of TFT. Film 404 may alternatively be made of silicon oxide/nitride or silicon nitride. An aluminum film 405 is then deposited by sputtering to a thickness of 500 nm on film 404. Film 405 overlies film 404 and will act as the gate electrode of TFT. Film 405 contains an impurity of scandium at 0.2 weight percent (wt %). Film 405 may alternatively be made of other conductive materials, such as tantalum, molybdenum, or others.

The structure of FIG. 4A is then subject to formation of an anode oxide film (not shown) of typically 10-nm thick overlying the aluminum film 405. This formation process uses as electrolytic solution ethylene-glycol solution as neutralized using ammonia water. Anode oxidization is carried out in such a way that when the structure is put in the electrolytic solution, film 405 is used as the anode while a platinum layer (not shown) as cathode therefor. An anode oxide film thus formed at this step is dense enough to improve the contact or adhesion characteristics with a later-formed resist mask thereon.

Figure 4B:
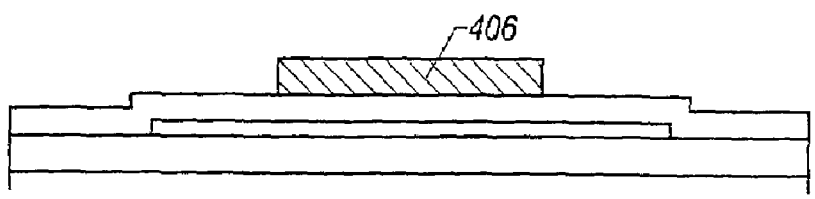

As shown in FIG. 4B, the aluminum film 405 is patterned forming an island 406 on silicon oxide film 404. The aluminum island 406 will serve as a base layer of the TFT gate electrode. Although omitted from the depiction of FIG. 4B, a mask layer used for patterning film 405 of FIG. 4A is not yet removed and thus continue to reside at this stage.

Figure 4C:
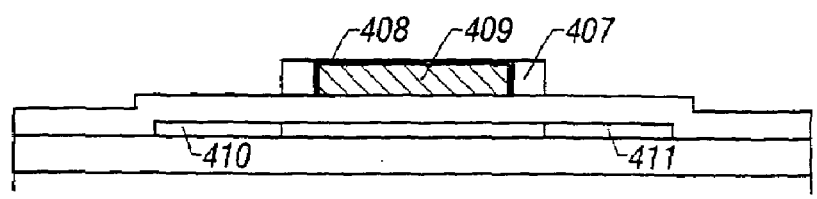

The structure of FIG. 4B is again subjected to the anode oxidation process with island 406 being as the anode. The electrolytic solution here may be aqueous solution of 3%-oxalic acid. At this step the anode oxidization progresses only at the side walls of island 406 due to the presence of the aforesaid resist mask (not shown). This results in formation of anode oxide films 407 only at opposite side walls of island 406 as shown in FIG. 4C. These side wall films 407 are porous in nature and are capable of uniformly growing to span an increased distance of several micrometers (μm). Porous side-wall films 407 measure 700 nm in thickness. This thickness is well controllable by adjustment of the time length of oxidation. After formation of films 407, the resist mask is then removed away. Anode oxidation process is again carried out forming a thin, dense anode oxide film 408 covering island 409. This process may be similar in condition to the above-described anode oxidation. Note in this step that the anode oxide film 408 is formed by taking account of the fact that the electrolytic solution used attempts to enter or soak into porous anode oxide films 407. Increasing the thickness of film 408 up to 150 nm or greater may permit formation of a required off-set gate region in a later step of injection of chosen impurity ions thereinto. Such dense film 408 will be able to function at a later step to suppress or eliminate occurrence of hillocks on the surface of a TFT gate electrode (as will be denoted by numeral 409 later).

After formation of the thin dense anode oxide film 408, an impurity of a chosen conductivity type—here, P type conductivity for manufacture of an N-channel TFT (NTFT)—is doped or injected by ion implantation into the underlying patterned silicon film 403, thereby forming spaced-part heavily-doped regions 410, 411 as shown in FIG. 4C, which will act as the source and drain of a TFT structure.

Figure 4D:
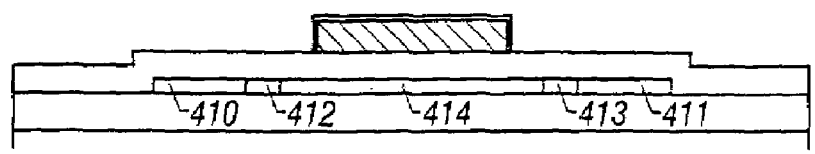

The porous anode oxide films 407 are selectively etched away using chosen etchant of a mixture of acetic acid, phosphoric acid and nitric acid. Thereafter, P-type impurity ions are again injected into resultant structure. The charge dose of this ion injection may typically be less than that for formation of the source and drain regions 410, 411 in film 403. Spaced-part lightly-doped regions 412, 413 are thus defined in film 403, which are in contact with the inner edges of heavily-doped source and drain regions 410, 411 as depicted in FIG. 4D, while allowing an intermediate region 414 between regions 412, 413 to be self-aligned with the overlying gate electrode island 409. The intermediate region 414 is as a channel region for TFT structure.

After impurity injection the structure of FIG. 4D is then subject to annealing treatment by irradiation of a laser beam, infrared beam or ultraviolet (UV) beam. In this way, the basic fundamental TFT structure called the "lightly-doped drain (LDD)" structure is obtained which comes with the source region 410, lightly-doped regions (LDD regions) 412, 413, channel region 414, and drain region 411.

It is recommendable at this stage that plasma hydrogenation treatment be performed at temperatures of from 300 to 350° C. for 0.5 to 1 hour. This process is for doping hydrogen into the active layer 403 at a predetermined concentration, such as 5 at % ($1\times10^{21}$ atoms/cm$^3$ or less); preferably, $1\times10^{15}$ to $1\times10^{21}$ atoms/cm$^3$ or less. The doped hydrogen can neutralize and remove the unpaired coupling hands of silicon atoms in active film 403 or the level of an interface between the active layer and gate insulating film.

Figure 4E:
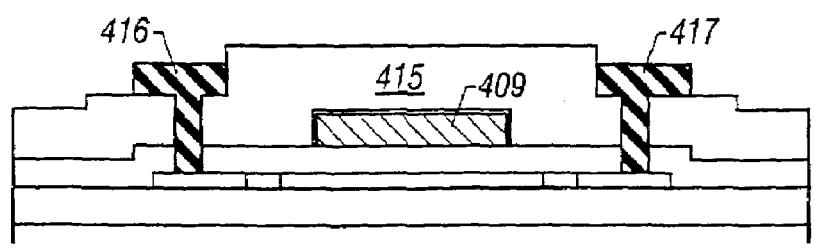

Next, as shown in FIG. 4E, a dielectric film 415 is deposited as an interlayer insulation layer on the structure of FIG. 4D. Film 415 may be made of silicon oxide, silicon nitride, silicon oxide/nitride, resin or any multi-layered combination thereof. The use of silicon nitride is preferable due to the capability of elimination of rediffusing out of hydrogen doped at the previous step toward exterior of the device structure. Interlayer insulation film 415 is then patterned defining openings that act as contact holes for electrical interconnections required. Metallic layers 416, 417 are next deposited to fill these contact holes with metal providing source and drain electrodes of TFT.

In cases where this TFT is for use as a pixel transistor in active-matrix LCDs, there is not required any take-out or pad electrode for applying a potential to the gate electrode 409; alternatively, where the TFT is for use in peripheral driver circuitry, it will be required that a takeout or pad electrode electrically associated with gate 409 be formed simultaneously. The resultant structure is thereafter subject to hydrogenation by execution of heat treatment at 350° C. in the hydrogen gas atmosphere. A TFT structure is thus completed as shown in FIG. 4E.

The TFT structure thus fabricated may offer field-effect carrier mobility excellent enough to attain high speed switching operations required. This is due to the fact that its active layer is fully comprised of the mono-domain region. The reliability can also be enhanced since there are no substantive grain boundaries in the channel region and at the drain contact while eliminating segregation of nickel compounds thereinto.

EXAMPLE 3

An explanation will now be given of a significant advantage of the thermal oxidation process in the atmosphere containing halogen elements for formation of the mono-domain region as has been discussed previously in Example 1.

Figure 6:
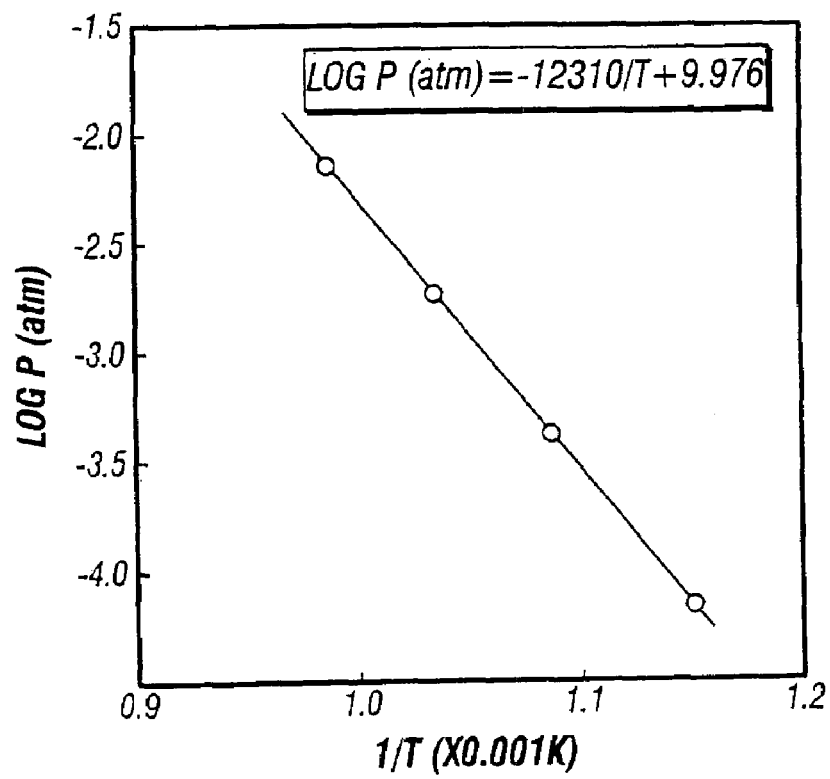
FIG. 6 is a graph showing the relation of the vapor pressure nickel chloride versus temperature.

See FIG. 6. This diagram is a graph showing the relation of vapor pressure of nickel chloride ($NiCl_2$) versus temperature. As shown, since $NiCl_2$ is a sublimative material, Ni in the mono-domain crystalline silicon film 111 of FIG. 2C may exhibit sublimation in nature as soon as it is gettered by chlorine. Resultant nickel chloride compounds will be released from the crystalline silicon film by outdiffusing into the air or by being absorbed by its overlying thermal oxide film. This advantageously serves to enable successful removal of Ni from the silicon film.

Electrical characteristics of the TFT structure of FIG. 4E will be described with reference to FIG. 5, which demonstrates the relation of gate current (Vg) versus drain voltage (Id) of the TFT. In this graph two Vg-Id characteristic curves are plotted: One curve 501 is that of the TFT of FIG. 4E in accordance with the invention; the other 502 is of a standard TFT as fabricated without the thermal or heat treatment and nitride anneal steps.

Comparing the two transistor characteristics 501, 502 reveals the fact that a turn-on current flowing in the TFT of the present invention is greater by two to four orders of magnitude than that of the standard TFT. The turn-on current refers to a drain current that attempts to flow while TFT is rendered conductive upon application of a gate voltage of 0 to 5 volts as shown in FIG. 5.

Figure 5:
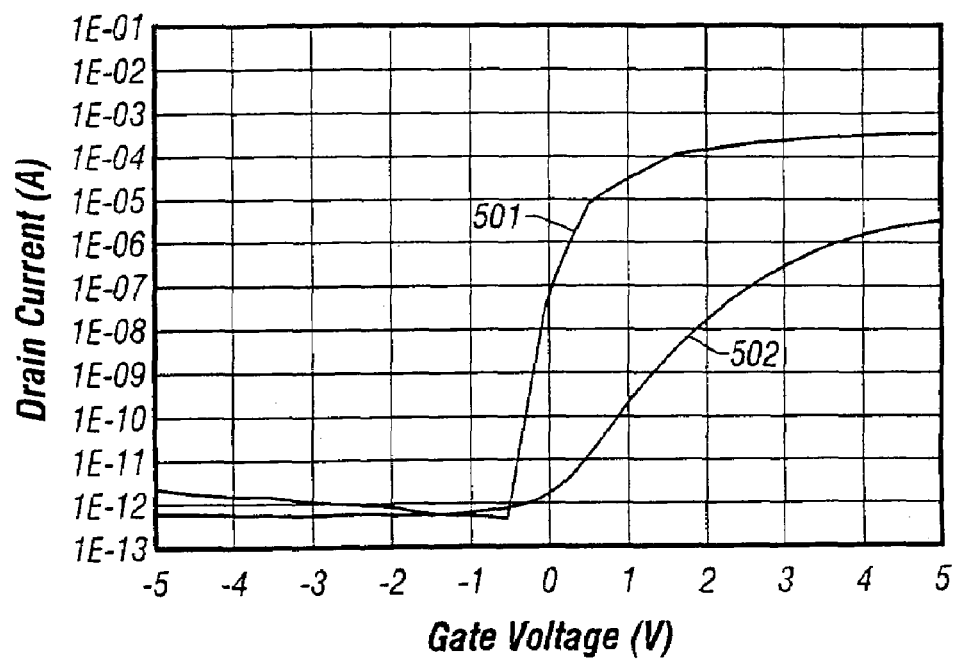
FIG. 5 is a graph showing the electrical characteristics of a thin-film transistor (TFT).

It can also be seen from viewing the graph of FIG. 5 that the TFT of FIG. 4E is greater in sub-threshold characteristic than the standard TFT. The "sub-threshold" characteristic, as used herein, is a measure representative of the sharpness of TFT switching operations: As a skilled person readily recognizes, the more sharp the rising angle of Id-Vg curve when TFT switches from the off to the on state, the better the subthreshold characteristics.

Attention should further be paid to the fact that while the subthreshold characteristics of the standard TFT remains around 350 mV/decade, that of the present invention is as low as approximately 100 mV/decade. This tells that the TFT of the invention is also enhanced in switching performance. In regard to the field-effect carrier mobility which serves as a parameter for estimation of TFT operation speed, the standard TFT is 80 to 100 $cm^2/Vs$ whereas the present invention is as large as 180 to 200 $cm^2/Vs$. This means that the latter can operate at high speeds accordingly. From the foregoing, it can be experimentally demonstrated that the TFT structure of the instant invention is capable of being much improved in electrical characteristics.

EXAMPLE 4

Our experimentation demonstrates a significant advantage of the getter action of metallic element using chlorine as will be set forth below in connection with the TFT structure of FIG. 4E.

Figure 7:
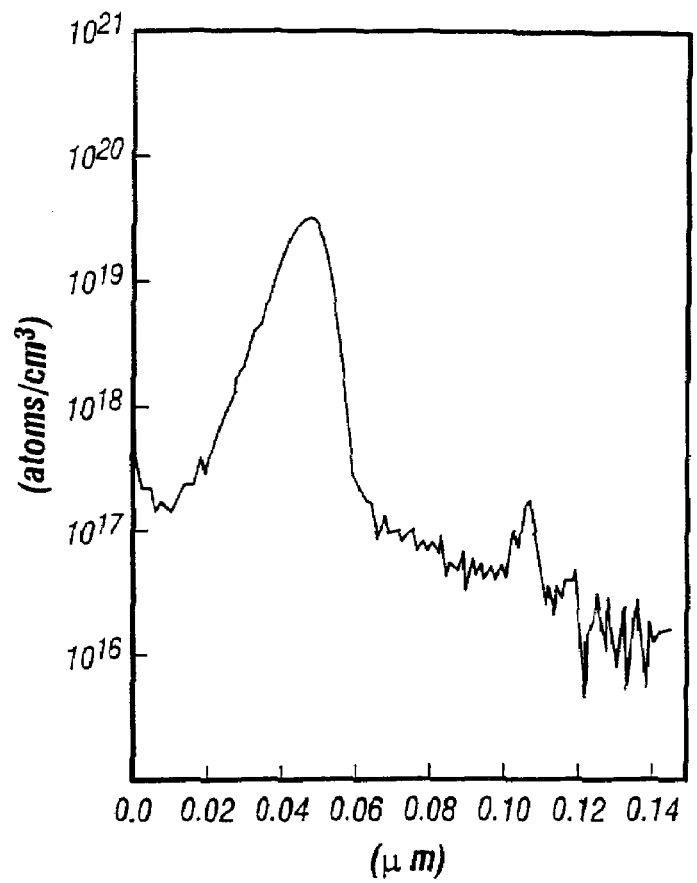
FIG. 7 is a graph showing the distribution of concentration of chlorine as contained in a crystalline silicon film.

See FIG. 7, which is a graphical representation of an experimental result indicative of the concentration distribution of the crystalline silicon film along the profile thereof, as measured using the SIMS analysis. Note here that measurement data with respect to certain region close in position to the film surface may be somewhat insignificant due to presence of the risk of affection or influence from possible surface irregularity and absorbed residual objects therein. Note also that for the same reason, data near interfaces will possibly involve errors. As can be seen from the graph of FIG. 7, chlorine is much present at or near the interface between crystalline silicon film and its overlying thermal oxide film. It is likely that this is because chlorine absorbed in the surface of crystalline silicon film at the beginning of the heat treatment outdiffuses into the thermal oxide film with Ni gettered. It is also considered to suggest that a number of unpaired coupling hands called the "dangling bonds" which have been at the surface of the crystalline silicon film prior to formation- of the thermal oxide film are terminated with those of chlorine.

EXAMPLE 5

Figure 8:
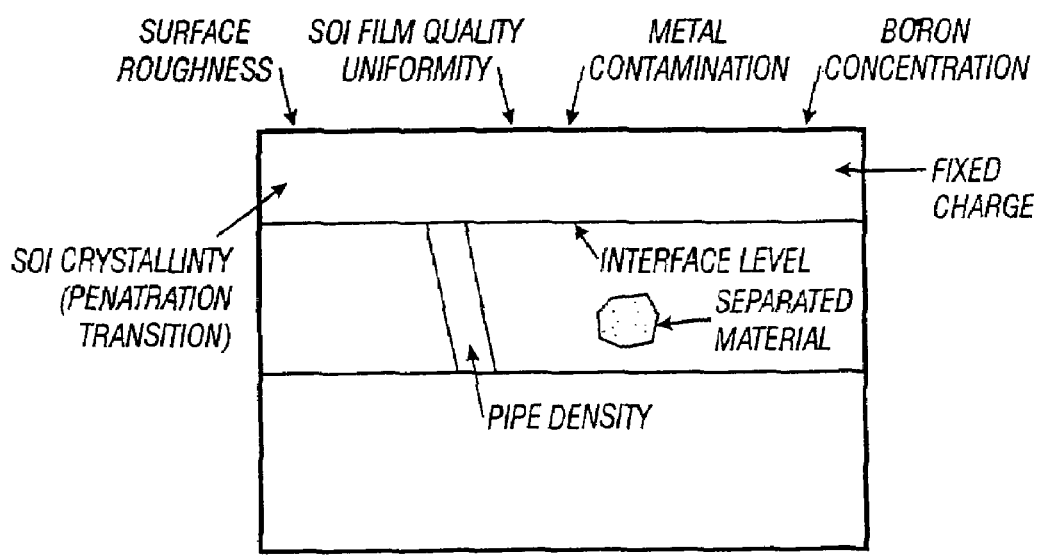
FIG. 8 is a diagrammatic representation for explanation of problems faced with a known semiconductor-on-insulator (SOI) structure.

One characterizing feature of the TFT-SOI structure having a single-crystal on a silicon substrate with a silicon oxide film being laid therebetween is the capability of successfully suppressing or eliminating inclusion of any bad parameter elements which can affect or disturb the crystal characteristics—such as pipe density, interface level, fixed charge, penetration transition, and the like in resultant mono-domain crystalline active layers. More specifically, while the SOI structure may exhibit an enhanced reduction in power dissipation as a result of recent developments in the semiconductor technology, it still suffers from a problem. See FIG. 8. This diagram is an illustration summarizing several possible factors that can affect the crystallinity in one typical SOI structure: The level of interface and fixed charge in a silicon film, which are originated from the crystal structure; and, metal contamination and concentration of boron—these are due to external affection. Bad behavior of such factors can be minimized or eliminated by the fabrication method of the present invention, which specifically includes the steps of heating the crystalline silicon film in the atmosphere containing halogen, thereby allowing both single-crystallization of silicon film and gettering of metallic element to be carried out at a time. Execution of the gettering process removes away any possible metal contamination therein. This is mainly due to the halogen elements' action, which may secondarily serve to increase in number unpaired coupling hands of silicon atoms that have been disengaged from nickel atoms. The single-crystallization by thermal annealing process may offer an advantage that any inferior factors can be suppressed or eliminated such as irregularity of pipe density, interface level, fixed charge, penetration transition, and others. Insofar as the deposits or precipitates illustrated in FIG. 8 are silicide-based materials, these can be removed away by the getter action of halogen elements. If such are oxide materials, these will be expected to disappear as a result of oxygen's reseparation for diffusing during the heat treatment.

EXAMPLE 6

Figure 9:
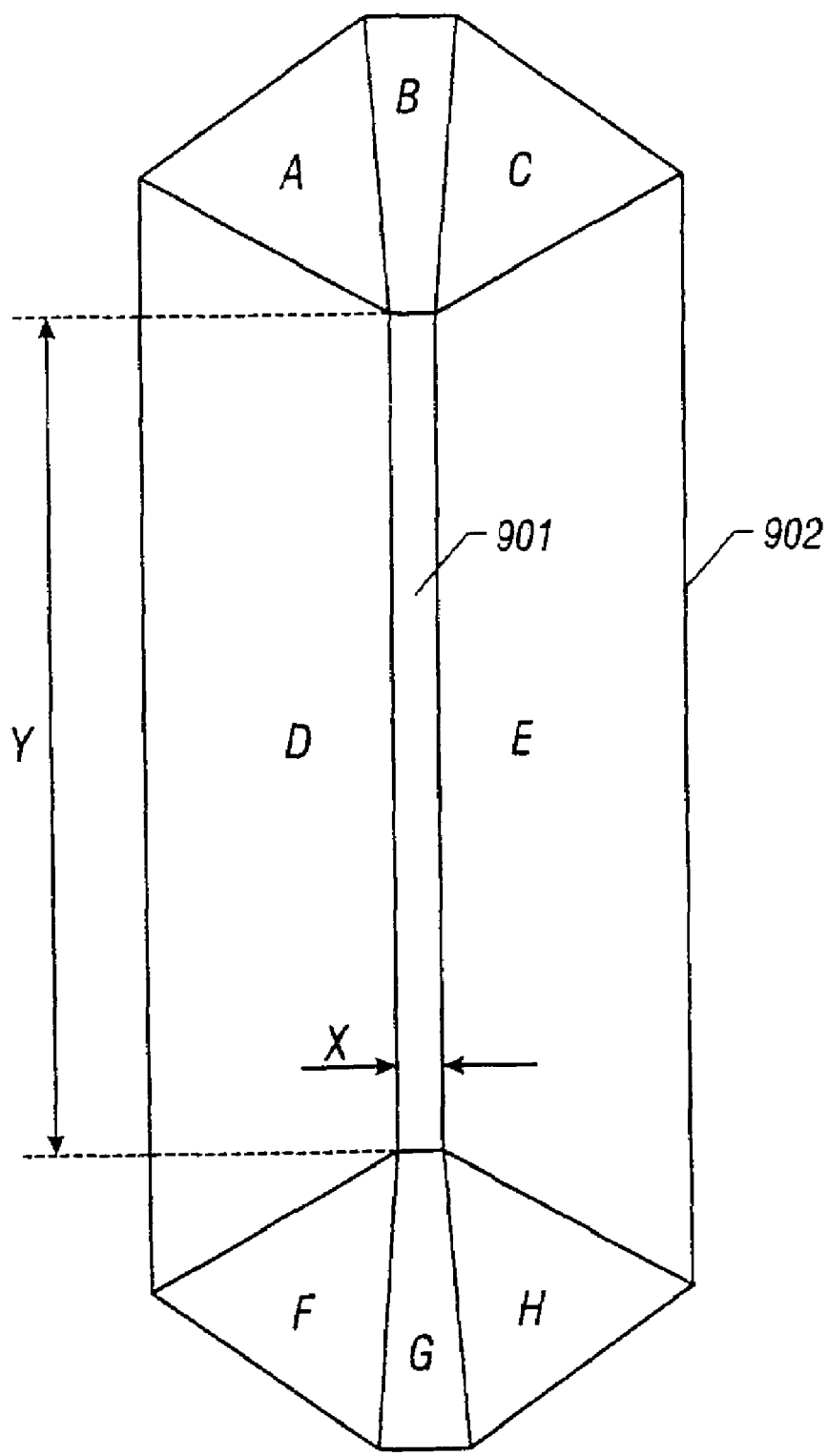
FIG. 9 shows a planar structure of a mono-domain region in accordance with a further embodiment of the invention.
Figure 10A:
FIGS. 10A to 10F illustrate in schematic cross-section some of the major steps in the formation of a semiconductor thin-film with crystallinity in accordance with one prior known approach.
Figure 10B:
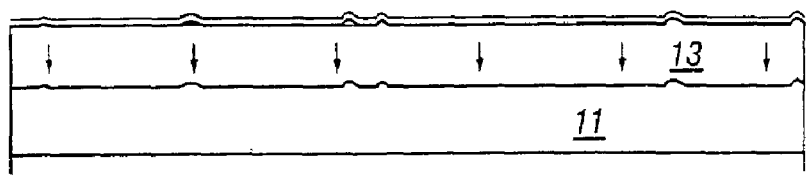
Figure 10C:
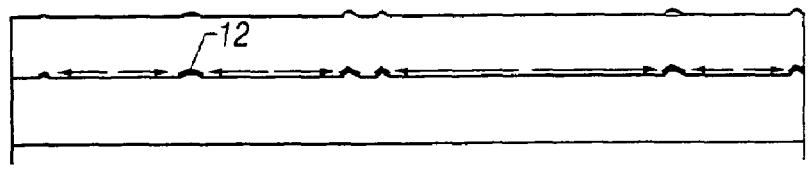
Figure 10D:
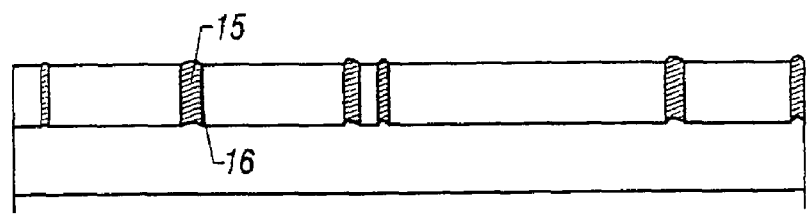
Figure 10E:
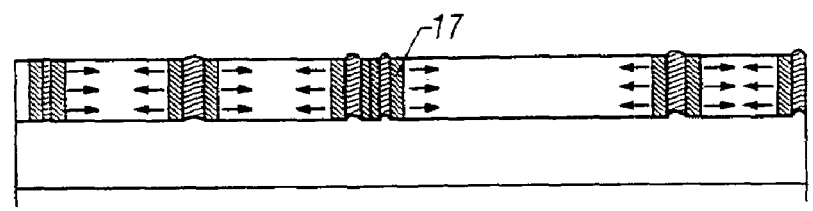
Figure 10F:
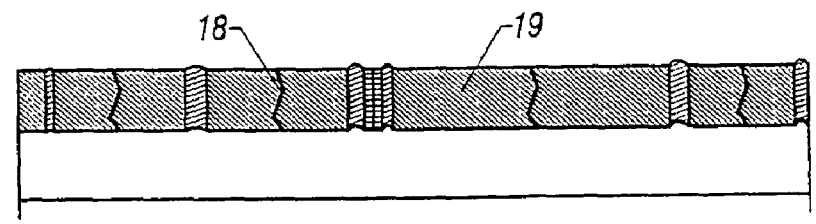

One possible modification of the formation of the surface projection 103 on the silicon oxide buffer layer 102 of FIG. 1A is shown in FIG. 9, wherein projection 103 is replaced with an elongate rectangular groove although this may still alternatively be an elongate projection of a corresponding planar shape. The resulting crystal grains grown are obtained in a manner similar to that of the embodiment shown in FIGS. 1A to 1F.

As shown in FIG. 9, a lateral crystal growth region 902 is formed with a vertical growth region 901 being as a crystal nucleus or seed. A difference of region 902 from the region 302 of FIG. 3A is that the seed is in a linear shape rather than a pin-point shape. Due to such difference, the lateral growth region 902 exhibits elongated hexagon in planar shape as seen from FIG. 9. As shown, this region 902 actually grown on a quartz substrate is subdividable into eight segments A to H in such a manner that the opposite sets of segments A-C, F-H positioned along the length Y of seed 901 are negligibly less in area than the remaining, two segments D and E which are at the opposite sides of seed 901 along the width X thereof. This is due to the fact that the length Y of vertical growth seed 901 is sufficiently greater in length than its width X.

One advantage of this arrangement is that when such wide segments D, E of FIG. 9 are single-crystallized, corresponding resultant mono-domain regions are increased in area. Employing these enlarged mono-domain regions for formation of TFT active layers may enable multiple active layers to be defined in one mono-domain region having the same and uniform crystallinity.

EXAMPLE 7

A fabrication method of a complementary metal oxide semiconductor (CMOS) transistor is shown in FIGS. 12A to 14D, which make use of the TFT formation process of Example 2 although the present invention should not be exclusively limited thereto.

Figure 12A:
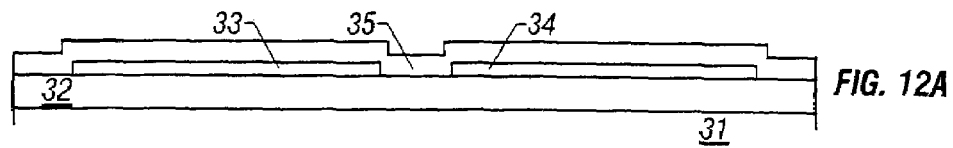
FIGS. 12A to 12E, 13A-13D and 14A-14B illustrate in schematic cross-section some of the major steps in the formation of a semiconductor device in accordance with a further embodiment of the invention.

As shown in FIG. 12A, a quartz substrate 31 is prepared on which a silicon oxide film 32 is deposited using the process earlier described with reference to FIGS. 1A-2C. Film 32 has a surface on which a mono-domain crystalline silicon film is deposited using the technique in a manner similar to that as has been discussed previously. This silicon film is then patterned to define spaced-apart mono-domain active layers 33, 34: One 33 is for the active layer of an N-channel TFT (NTFT); the other 34 is for that of a P-channel TFT (PTFT). Only two transistors are depicted for purposes of explanation only; practically, when the invention is reduced to practice, several millions of P- and N-channel TFTs are formed by microelectronics fabrication techniques on a single chip substrate.

After formation of the mono-domain active layers 33, 34, an overlying gate insulating film 35 is next deposited by plasma CVD techniques to a predetermined thickness, such as 50 to 200 nm, preferably 100 to 150 nm. Film 35 may be made of silicon oxide, silicon oxide/nitride, silicon nitride, or other available dielectric materials. The structure of FIG. 12A is thus obtained.

Figure 12B:
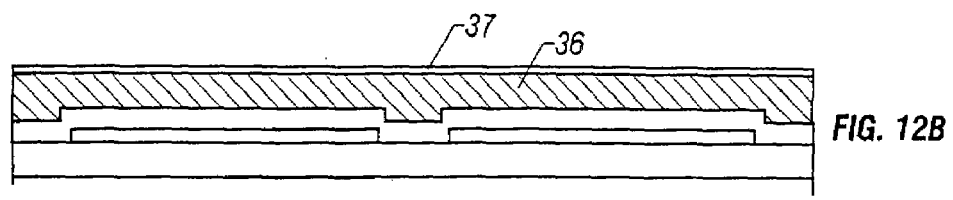

Then, as shown in FIG. 12B, a conductive film 36 is deposited by sputtering or electron-beam deposition techniques over the structure of FIG. 12A. Film 36 may be made of aluminum and will act as gate electrodes of TFTs later. Film 36 contains therein scandium at 0.2 weight percent (wt %) for elimination of occurrence of hillocks or whisker. These refer to thorn-like or needle-like projections as created due to abnormal crystal growth of aluminum. Presence of such projections will badly behave to cause unwanted short-circuit and crosstalk between adjacent wire leads or between laminated chip leads. Film 36 may alternatively be made of anode-oxidizable metallic materials, including tantalum.

At the step of FIG. 12B a thin dense film 37 is formed on the aluminum film 36 by anode oxidation process in electrolytic solution with film 36 as the anode thereof. The electrolytic solution here is ammonium-neutralized ethylene glycol solution containing dihydroxysuccinic acid at 3%. The use of such anode oxidation enables formation of a uniform oxide film with enhanced density as well as thickness controllable by adjustment of a voltage as externally applied thereto. Film 37 here measures 10 nm in thickness, and will play a role of improving or enhancing the adhesion characteristics of a resist mask to be later formed thereon.

Figure 12C:
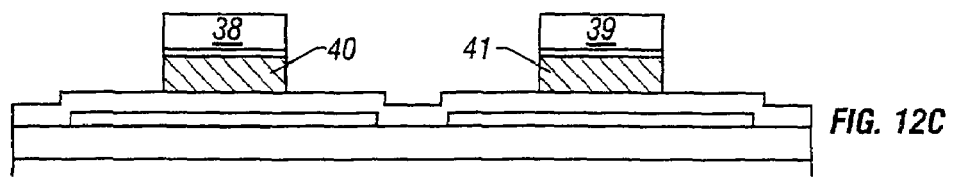
Figure 12D:
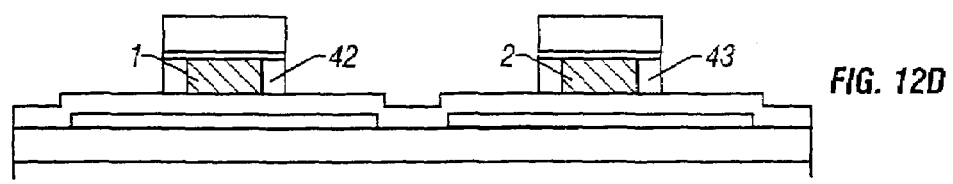

Next, as shown in FIG. 12C, a patterned photosensitive resist layer having mask segments 38, 39 is formed on the structure of FIG. 12B. With photoresist masks 38, 39, the underlying aluminum film 36 and anode-oxidation oxide film 37 are subject to patterning process to obtain a structure of FIG. 12C having correspondingly patterned film segments 40, 41. This structure is then subject to anode oxidation process with films 40, 41 being as the anode electrode During this process the anode oxidation selectively progresses only at the side walls of each film 40, 41. This is because of the fact that a lamination of the dense film 37 and mask segments 38, 39 resides on the upper surface of films 40, 41. As a result, porous oxide films 42, 43 are grown to a thickness of several micrometers on the side walls of films 40, 41. The progress distance of such anode oxidation—i.e., the thickness of side-wall oxide films 42, 43—is 700 nm, by way of example. The anode oxidation distance will determine the length of lightly-doped regions to be formed later. Our experimentation suggests that the thickness of films 42, 43 preferably falls within a range of from 600 to 800 nm. At this stage the structure of FIG. 12D is with gate electrodes 1, 2 as shown.

Figure 12E:
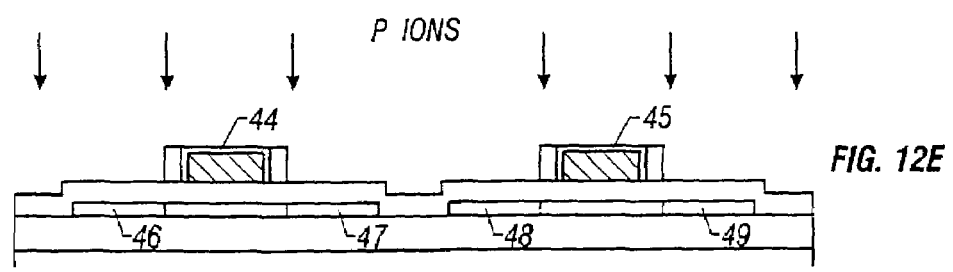

After the resist masks 38, 39 are removed away, the structure of FIG. 12D is again subjected to the anode oxidation using similar electrolytic solution. During this process the solution attempts to enter and fill the inside of porous side-wall oxide films 42, 43. Dense side-wall oxides 44, 45 are thus formed as shown in FIG. 12E. These oxides 44, 45 are typically 50 to 400 nm thick. This thickness is controllable by adjustment of externally applied voltages. Any residual portions of the earlier formed dense oxides 37 become integral with oxides 44, 45.

At the step of FIG. 12E the resultant structure is doped with an N type impurity such as phosphorus (P) over the entire surface thereof. The charge dose is as high as $2\times10^{14}$ to $5\times10^{15}$ cm$^{-2}$; preferably, the dose may range from 1 to $2\times10^{15}$ cm$^{-2}$. Known plasma- or ion-implantation techniques may be employed. As a result, heavily-doped regions 46-49 are defined in the mono-domain active layers 33, 34 as shown in FIG. 12E. One pair 46, 47 is self-aligned with its corresponding gate electrode 1 having side-wall oxides 42; the other pair 48-49 is self-aligned with gate electrode 2 having side-wall oxides 43.

Thereafter, the side-wall oxide films 42, 43 are removed using chosen etchant of aluminum-mixed acid. At this time the active regions just beneath oxides 42, 43 remain essentially intrinsically pure in nature due to inhibition of any ion doping thereinto.

Figure 13A:
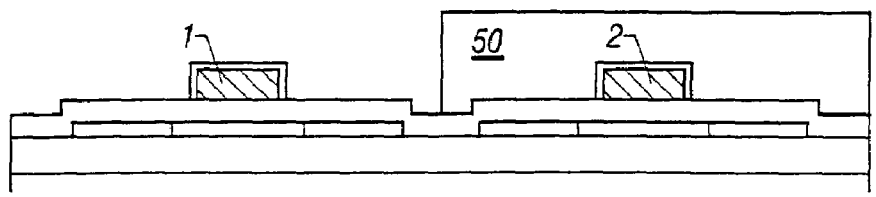

After removal of oxides 42, 43 a photoresist mask layer 50 is selectively formed covering the right-hand surface area whereat a PTFT will be formed as shown in FIG. 13A. The left-hand surface area of the structure of FIG. 13A is kept exposed as shown.

Figure 13B:
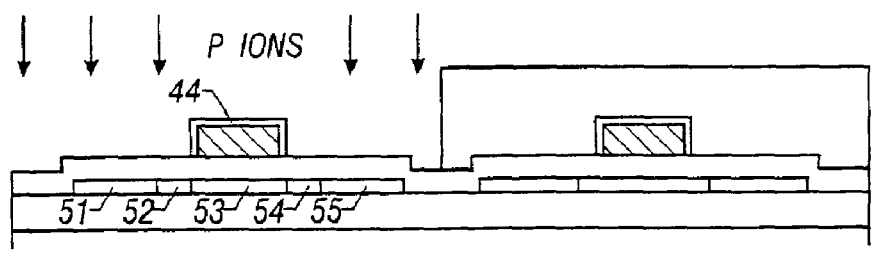

Then, as shown in FIG. 13B, the structure is doped with a P-type impurity at a relatively low charge dose as compared to that at the step of FIG. 12E, such as $1\times10^{13}$ to $5\times10^{14}$ cm$^{-2}$; preferably, $3\times10^{13}$ to $1\times10^{14}$ cm$^{-2}$. As a result of such impurity doping, spaced-apart lightly-doped regions 52, 54 are defined at selected portions of the mono-domain active layer 33, which have been located beneath the sidewall oxides 42 now removed away. These regions 52, 54 are self-aligned with the gate electrode 1 as shown. Heavily-doped regions 51, 55 are also defined at outer locations of active layer 33 in such a manner that region 51 is in contact with region 52 whereas region 55 is with region 54. These outer heavily-doped regions 51, 55 will act as the source and drain of NTFT, respectively. Inner lightly-doped regions 52, 54 laterally lie at the opposite ends of an intrinsic channel formation region 53, which is self-aligned with the gate electrode 1. One region 54 which is positioned between channel region 53 and drain 55 acts as the so-called "lightly-doped drain (LDD)" region.

It should be noted in FIG. 13B that non-doped regions (not shown) exist between the channel 53 and lightly-doped regions 52, 54 as originated from the fact that the presence of thin oxide 44 covering the surface of gate electrode 1 eliminates ion injection thereinto during the impurity doping. Such non-doped regions are equivalent in width to the thickness of oxide 44, and are generally called the "off-set gate" regions in the art to which the invention pertains. The offset gate regions are essentially intrinsic with no impurity doped thereinto; however, in the absence of gate voltages, they do not contribute to formation of a channel and therefore function as a resistance component which weakens the intensity of internal electric field to suppress or eliminate deterioration of material quality increasing the net life of TFTs. Note here that where the offset width is decreased, resultant offset regions will no longer exhibit such functions. Any quantitative analysis thereon has not been completely established yet.

Figure 13C:
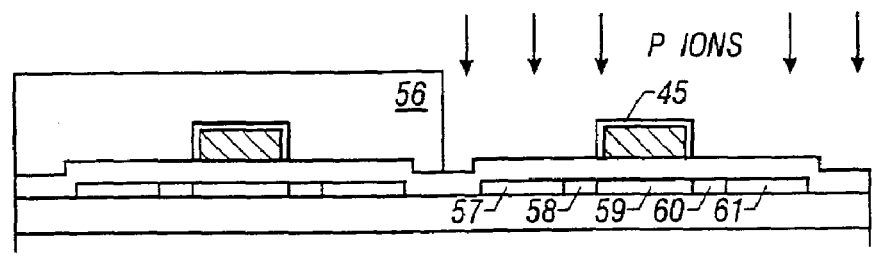

After formation of the NTFT, as shown in FIG. 13C, the resist 50 is removed, and another patterned photoresist layer 56 is then deposited covering the NTFT at the left-hand side in the illustration. With this resist 56 being as a mask, a P-type impurity, such as boron (B), is doped into the structure of FIG. 13C. The charge dose is $2\times10^{14}$ to $1\times10^{16}$ cm$^{-2}$; preferably, 1 to $2\times10^{15}$ cm$^{-2}$, although it may alternatively be the same as that at the step of FIG. 12E if appropriate. Doped regions 57, 61 are thus defined at opposite sides of the mono-domain active layer 34. While these regions may contain both N-type and P-type impurities, these essentially function as contact pads for electrical interconnection with associated pad electrodes to be coupled to chip leads. In other words, unlike the left-hand side NTFT structure, the PTFT functionally distinguishes the regions 57, 61 from its source and drain regions. In this respect, it will be seen that the source and drain of PTFT consist of other doped regions 58, 60 as self-aligned with its corresponding gate electrode 2, respectively. These regions 58, 60 have been defined by injecting only B ions into the locations that have been essentially intrinsic in nature. For this very reason any other ions do not exist here facilitating the controllability of impurity concentration, which in turn enables achievement of PI junctions excellent in crystal-lattice matching property while reducing crystal irregularity otherwise occurring due to ion injection. Note that the formation of offset gate regions remains available by use of the oxide film 45 covering the surface of gate 2 if required in some cases; however, the illustrative structure does not come with such offset regions by taking account of the fact that our experimentation revealed that PTFTs will hardly degrade as compared to NTFTs.

In this way, as shown in FIG. 13C, the source and drain regions 58, 60 are formed in the mono-domain active layer 34 of PTFT. An intermediate non-doped region laid between source and drain 58, 60 defines a channel formation region. The doped-regions 57, 61 at the opposite side portions of active layer 34 will act as contact pads for supplying current to source 58 or deriving it from drain 60.

Figure 13D:
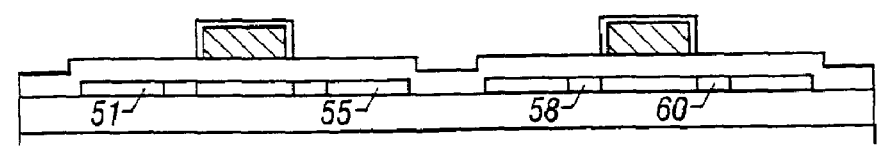

After the resist 56 is removed, as shown in FIG. 13D, resultant structure is then exposed to a laser beam for activation of doped impurity as well as annealing of doped-regions. The laser irradiation may be carried out while reducing a difference in crystallinity between a pair of source and drain regions 51, 55 of NTFT and another pair of source and drain regions 58, 60 of PTFT. Absence of clear difference of crystallinity therebetween is originated from the fact that source and drain regions 58, 60 are not significantly damaged during the ion injection at the step of FIG. 13C. Accordingly, the laser annealing may cure the doped source and drain regions of the both TFTs to ensure that P- and N-channel TFTs are similar or identical in transistor characteristics to each other.

Figure 14A:
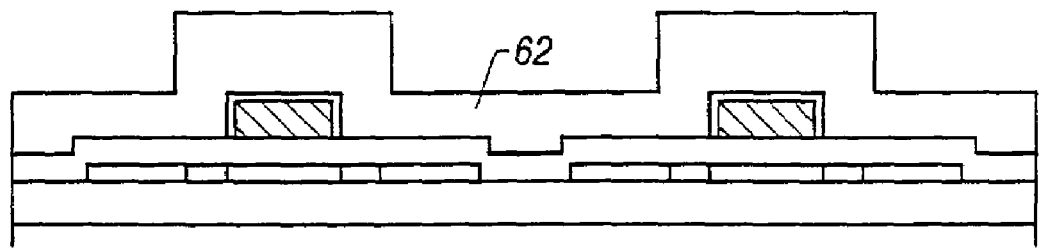

Next, as shown in FIG. 14A, an interlayer dielectric film 62 is deposited, by plasma or thermal CVD techniques, to a thickness of 400 nm on the entire surface of the structure of FIG. 13D. Film 62 may be made of silicon oxide, silicon oxide/nitride, silicon nitride, or any combinations thereof in a multilayer manner.

Figure 14B:
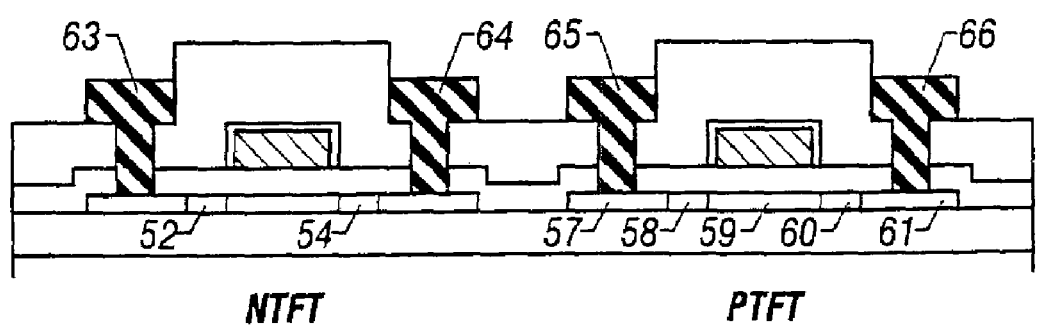

Finally, as shown in FIG. 14B, several required openings are defined as contact holes in the interlayer film 62. Patterned conductive films 63-66 are then selectively formed to fill the contact holes to act as source and drain electrodes of P- and N-channel TFTs. A chip lead pattern is also formed allowing the drain electrode 64 of NTFT to be electrically coupled to that 66 of PTFT while permitting interconnection between the insulated gate electrodes 1, 2 thereof. A CMOSTFT structure is thus obtained, which is applicable to advanced high-speed/high-precision display panels, including active-matrix LCDs, active-matrix electro-luminescence (EL) devices, and others.

One significant importance of the illustrative TFT manufacture scheme is that at the steps of FIGS. 12E, 13B and 13C, the mono-domain active layers 33, 34 are completely covered on surface by the silicon oxide film 35 which later acts as the gate insulating films after patterning. Performing ion-doping with active layers 33, 34 covered by oxide 35 may advantageously serve to reduce the risk of occurrence of irregularity and residual contamination on the active layer surface. This will greatly contribute to an increase in production yield as well as reliability of resultant TFTs.

EXAMPLE 8

Figure 2C:
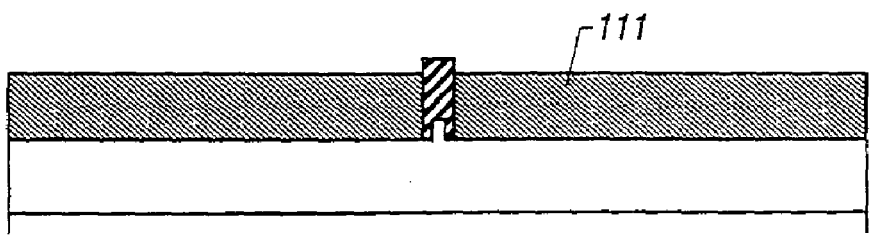

It should be noted that the mono-domain crystalline silicon film 111 as shown in FIG. 2C may alteratively be fabricated on a semiconductive substrate such as a silicon wafer. In this case it is required that an additional dielectric film be deposited on the top surface of the substrate. A currently available thermal oxide film may be employed for this purpose. A heat treatment therefor is carried out at temperatures typically ranging from 700 to 1300° C. for a predefined length of time period, which may vary with a change in target thickness. The thermal oxidization process is done in chosen atmosphere that burns $O_2$, $O_2$—$H_2O$, $H_2O$, $O_2$—$H_2$. Recent advance in the semiconductor art suggests that the oxidization may alternatively be done in the atmosphere containing therein chosen halogen elements, such as HCl, $Cl_2$ or the like. Since silicon wafers are a key to the recent semiconductor microfabrication technology due to the extended capability of forming thereon several types of semiconductor elements. Forming the mono-domain silicon film on such semiconductor wafers may further extend the applicability of the present invention in combination of the presently available silicon-wafer fabrication techniques.

Figure 15A:
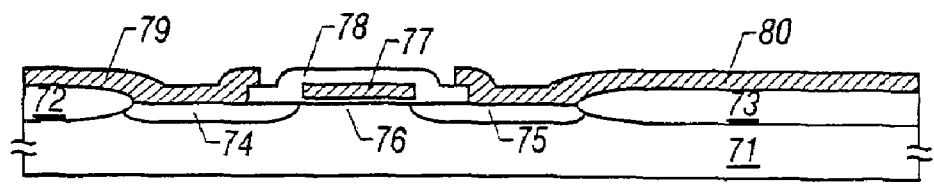
FIGS. 15A to 15D depict in schematic cross-section some of the major steps in the formation of a semiconductor device in accordance with a further embodiment of the invention.
Figure 15B:
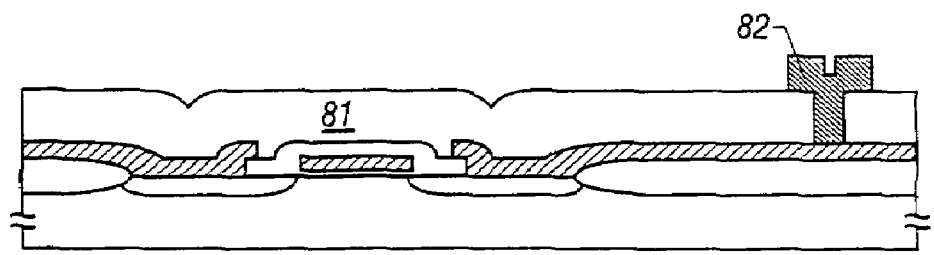

Turning now to FIG. 15A to 15B, a fabrication method of the mono-domain crystalline silicon film in accordance with a further embodiment of the invention is shown which is designed to form a TFT structure with such film being laid over an integrated circuit (IC) preformed on a silicon wafer under manufacture.

In FIG. 15A, there is shown (not drawn to scale) a MOSFET IC device which has been fabricated using known microfabrication techniques. This IC comes with a silicon substrate 71 having a top surface on which MOSFETs are formed along with associated element-separation dielectric layers 72, 73 as typically formed in a thermal oxide film. A MOSFET has spaced-apart source and drain regions 74, 75 in the surface of substrate 71. These may be fabricated through the injection step of doping an impurity of a selected conductivity type into substrate 71 and its following diffusion step. As well known, where substrate 71 is of P conductivity type, an N-type impurity such as phosphorus (P) is chosen for injection; if substrate 71 is of N type then a P-type impurity such as boron (B) is doped thereinto. The MOSFET also has a channel formation region 76 as defined between the source 74 and drain 75 in the substrate surface, and an insulated gate electrode 77 overlying the channel 76. Gate electrode 77 may be made of polycrystalline silicon.

Gate 77 is electrically insulated from substrate 71 by a gate insulating film which is sandwiched therebetween. This film may be a residual portion of a thermal oxide film as has been formed with thickness control during the diffusion step after ion injection for forming source 74 and drain 75. Gate 77 is covered by a silicon oxide film 78 for electrical isolation from a source electrode 79, a drain electrode 80 or other adjacent components on substrate 71.

As shown in FIG. 15B, an interlayer dielectric film 81 is deposited on the MOSFET-IC structure of FIG. 15A. Film 81 may be made of silicon oxide, silicon nitride; or others. A contact hole is defined in film 81 at a selected location. A patterned conductive wiring layer 82 is then formed as a chip lead, permitting electrical interconnection of drain electrode 80 to any required part or parts of the IC.

Figure 15C:
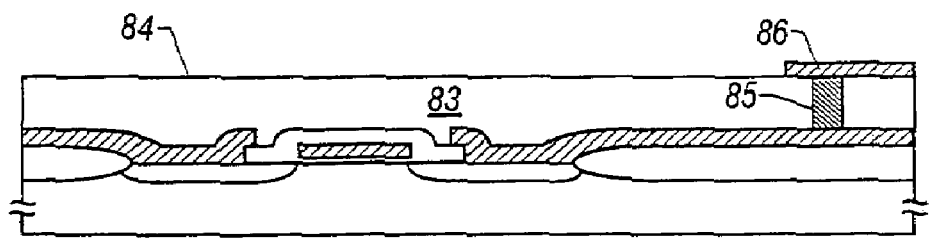

The structure of FIG. 13B is next subjected to surface polishing process using known chemical/mechanical polishing (CMP) techniques, obtaining a surface-flattened IC structure shown in FIG. 15C. As shown, due to such surface polish treatment, a resultant interlayer dielectric layer 83 exhibits flat, smooth top surface 84 with any undesired projections of lead 82 being removed away from it. In FIG. 13C numeral 85 is used to designate flattened portion of lead 82, on which a chip lead 86 is formed for interconnection with drain electrode 80. It is recommendable that the source electrode 79, drain electrode 80 and lead 86 be made of a carefully chosen heat-resistant material which is capable of withstanding against application of heat as increased up to 1100° C. This is in view of later heat application(s) during formation of a mono-domain crystalline active layer.

Figure 15D:
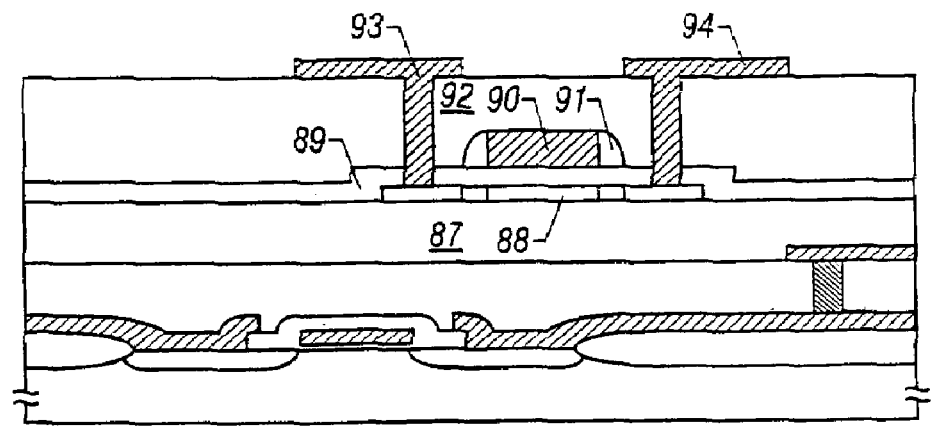

Next, as shown in FIG. 15D, an interlayer dielectric film 87 is deposited on the entire surface of the structure of FIG. 15C. A mono-domain crystalline silicon film which acts as the active layer of a TFT will be formed on this film 87. The formation of such active layer is similar in principle to that shown in FIGS. 1A-2C. More specifically, a patterned mono-domain crystalline silicon active layer 88 is formed on film 87. A gate insulating film 89 is deposited covering film 87 and active layer 88. A gate electrode 90 is then formed insulatingly overlying a channel region of active layer 88. A chosen impurity of a selected conductivity type is next doped into active layer 88.

After injection of impurity, insulators 91 are selectively formed on the opposite side walls of gate electrode 90. Formation of such side-wall insulators 91 includes the step of depositing a silicon oxide film (not shown) which is greater in thickness than gate 90 and which covers the entire surface thereof, and performing anisotropic dry etching to remove selected portions of such insulating film, thereby causing insulators to be reside only at the opposite side walls of gate 90 as shown.

A further injection of impurity is performed defining in active layer 88 the heavily-doped source and drain regions while allowing certain parts shielded by side-wall insulators 91 to remain as lightly-doped regions. Impurity activation process is then carried out using heat treatment and/or laser-beam irradiation. Thereafter, a dielectric film which may be made of silicon oxide or silicon nitride is deposited as the interlayer insulation layer. This layer is subject to etching process, forming contact holes therein. Finally, source and drain electrodes 93, 94 are formed providing electrical interconnections of source and drain in active layer 88 through the contact holes.

A significant advantage of the embodiment shown in FIGS. 15A to 15D is that a multiple-layered or "three-dimensional (3D)" structured TFT can be fabricated on or above the presently available IC devices. Specifically, with the 3D MOS-IC/TFT structure of FIG. 15D, the upper TFT can exhibit extra enhanced transistor actions that may be equivalent in speed and reliability to the lower standard MOSICs as fabricated on single-crystalline base plate such as silicon wafer or substrate 71 depicted. This advantageously serves to offer an increased integration or packing density for IC devices without having to reduce their inherent performance.

EXAMPLE 10

Figure 16A:
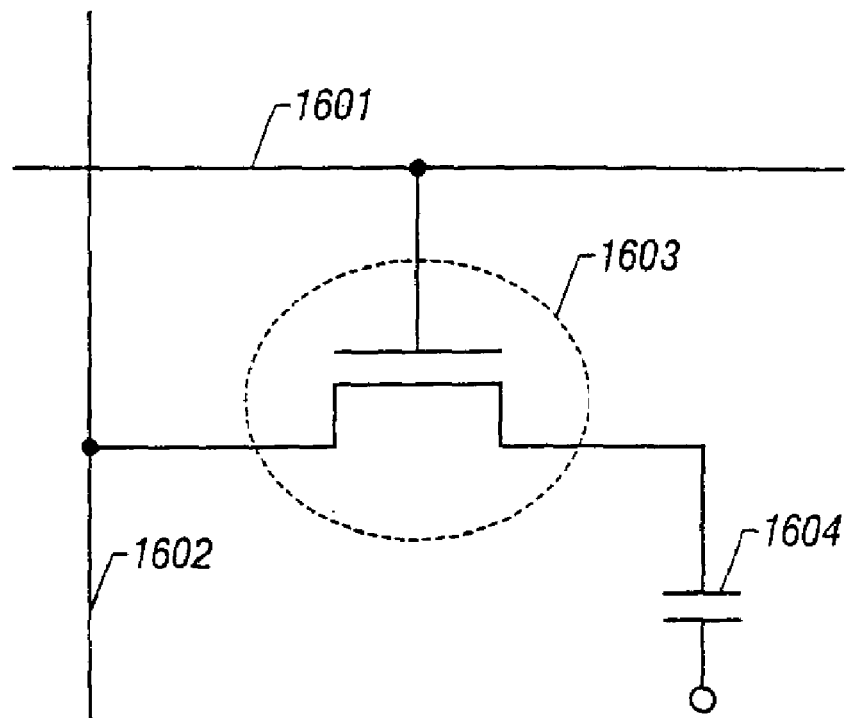
FIGS. 16A and 17A respectively show one cell section of a memory array of a dynamic random access memory (DRAM) and that of a static RAM (SRAM)

A dynamic random access memory (DRAM) device embodying the present invention is shown in FIGS. 14A and 14B, which employs the TFT structure of the invention. The DRAM includes an array of one-capacitor/one-transistor memory cells, one of which is shown in FIG. 16A. As shown, the memory cell includes a data transfer transistor 1603 having a gate coupled to a corresponding one of parallel word lines 1601, a source coupled to a corresponding bit line 1602, and a drain. Transistor 1603 is a TFT with an active layer as made of the mono-domain crystalline silicon film as has been described previously. The cell also includes an associative data storage capacitor 1604 having one electrode coupled to the drain of TFT 1603, and the remaining electrode as coupled to a fixed potential, such as ground. In the DRAM cell of FIG. 16A, upon application of a voltage signal of a selected potential at the word line 1601, this potential is applied to the gate rendering TFT 1603 conductive. This allows a data signal to be transferred from bit line 1602 through TFT 1603 to capacitor 1604 causing corresponding charge carriers to be accumulated or integrated therein for data write. During read operation the stored carriers are transferred via TFT 1603 to bit line 1602.

Figure 16B:
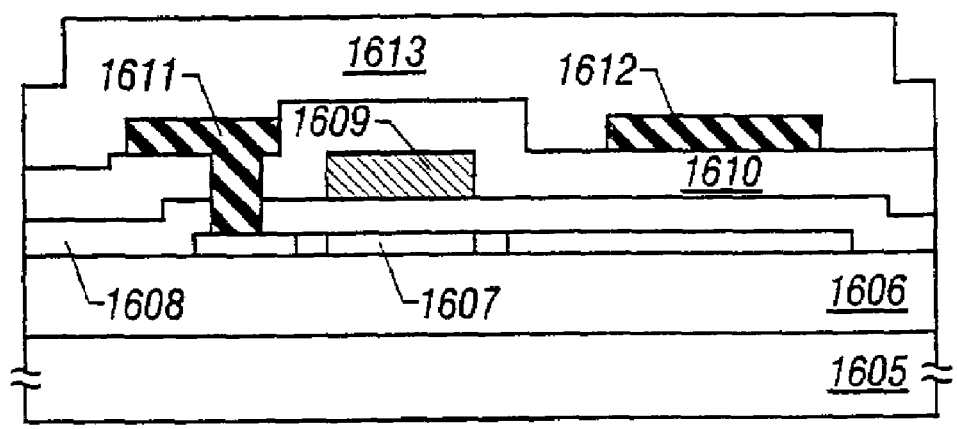
FIGS. 16B and 17B show cross-sections of each of the cells of the preceding figures.

See FIG. 16B, which shows a cross-sectional view of the DRAM cell of FIG. 16A. As shown, a quartz or silicon substrate 1605 has a top surface on which a silicon oxide film 1606 is formed. In the case of using a silicon substrate, the so-called semiconductor-on-insulator (SOI) structure can be used. Film 1606 may be a thermal oxide layer.

Formed on film 1606 is a TFT having a mono-domain crystalline silicon active layer 1607 in accordance with the principle of the present invention.

As apparent from FIG. 16B, the active layer 1607 is covered with an overlying gate insulating film 1608, on which an insulated gate electrode 1609 is arranged. An interlayer insulation film 1610 is laminated on film 1608 covering gate 1609. Film 1610 has a contact hole through which a source electrode 1611 is electrically coupled to the source region in active layer 1607 in a manner similar to those of the previous embodiments. Source electrode 1611 is also coupled to a corresponding bit line 1602 of FIG. 16B. Another conductive layer 1612 is also on interlayer insulation film 1610 as one electrode of the data storage capacitor 1604 of FIG. 16B, which defines a predefined capacitance between it and the underlying drain region of TFT in active layer 1607. Source electrode 1611, capacitor electrode 1610 and bit line 1602 are formed at a time. An insulating layer 1613 covers the entire top surface of the cell as a protective layer.

A significant feature of the embodiment shown FIGS. 16A and 16B is that leak current can be suppressed. This can be said because the TFT 1603 is employed to form the SOI structure in the low-cost/high-integration one-capacitor/one-transistor DRAM cell minimizing the junction area, which in turn leads to an increase in data-storage reliability.

Another advantage is to enable achievement of low-voltage operations due to the fact that the SOI-DRAM cell structure permits a decrease in the storage capacitance without reducing reliability and performance.

EXAMPLE 11

Figure 17A:
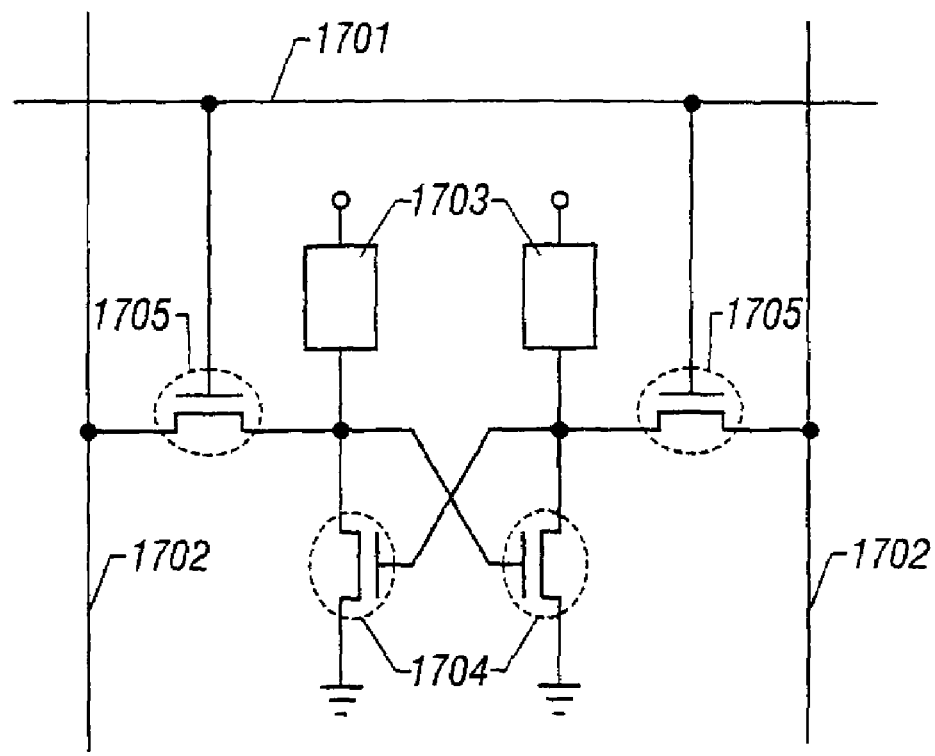
Figure 17B:
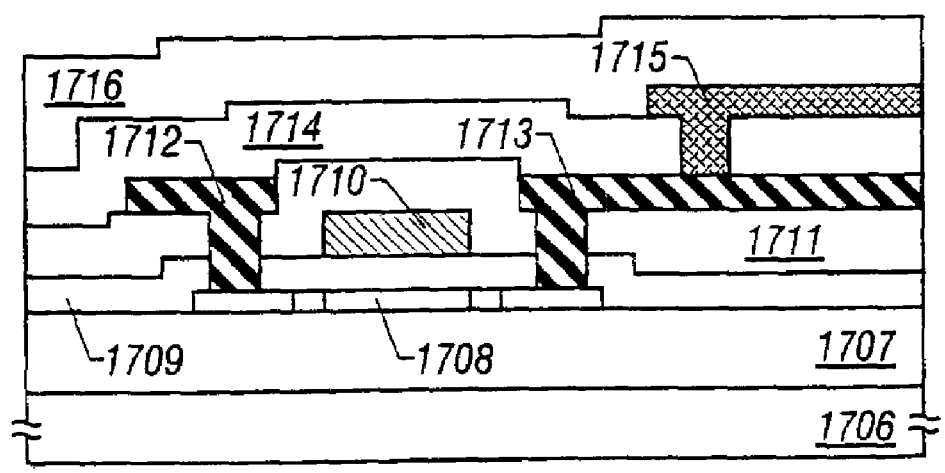

A static random access memory (SRAM) device also embodying the present invention is shown in FIGS. 17A and 17B, which employs the TFT structure of the invention. The SRAM includes an array of NMOS or CMOS memory cells each of which has bistable flip-flop (F/F) circuitry as shown in FIG. 16. The SRAM cell statically stores therein a binary one-bit data of logic "0" or "1" depending upon whether the F/F circuit turns on or off insofar as application of power continues. As shown in FIG. 17A, the cell is at an intersection between a word line 1701 and a pair of bit lines 1702, and includes a F/F circuit which is constituted from a pair of cross-coupled driver transistors 1704, and associative high-resistance load elements 1703. One pair of load 1703 and transistor 1704 is interconnected at a common node to one bit line 1702 via an access transistor 1705 having a gate coupled to the word line 1701; the other pair of load and transistor is connected to the other bit line 1702 through a similar access transistor 1705.

A cross-sectional view of a TFT for use in the SRAM cell is shown in FIG. 17B. A substrate 1706 may be made of quartz or silicon. A silicon oxide film 1707 is on substrate 1706 as the primary coat layer on which a mono-domain crystalline silicon active layer 1708 of the TFT is formed. Active layer 1708 is covered by a gate insulating film 1709, on which a patterned gate electrode 1710 is formed. An overlying interlayer dielectric film 1711 has contact holes through which source and drain electrode 1712, 1713 are electrically coupled to the source and drain regions in active layer 1708 as defined in the manner as described previously. Source and drain electrodes 1712, 1713 are fabricated along with bit lines 1702. An interlayer dielectric film 1714 and a polycrystalline film 1715 are laminated in this order. The latter film 1715 acts as the high-resistance load element 1703 of FIG. 17A. The overall multilayer structure is covered by a protective film 1716 made of a chosen dielectric material. With such an arrangement, the SRAM cell can exhibit high speed operation with reliability and mountability maximized due to the use of the TFT with mono-domain active layer 1708 as fabricated on the SOI substrate structure.

EXAMPLE 12

A further embodiment of the invention is drawn to a combination of the semiconductor device shown in FIG. 4E (EXAMPLE 2) and CMOS structure of FIG. 14B (EXAMPLE 7) to provide an active-matrix LCD device which has an array of rows and columns of active-matrix TFT pixels and an associated driver circuitry as integrated on a single chip substrate. More specifically, the pixel array makes use of at least one TFT for the individual one of these pixels. The driver circuitry is disposed at the periphery of the substrate surface to surround the TFT pixel array. The TFT structure of FIG. 4E which is equivalent in performance to single-crystalline MOSFETs is employed as such pixel TFTs whereas the CMOSTFT of FIG. 14B is as the driver TFTs.

A significant advantage of this active-matrix LCD device is that the turn-off current in pixel transistor can be reduced or minimized. The reason of this is as follows: Since the TFT active layer consists of the mono-domain crystalline silicon film as mentioned previously, there are no longer present any crystal grain boundaries otherwise serving to create a current path through which the turn-off current can rash to flow at increased priority. This in turn increases retainability of a packet of signal charge at the individual pixel electrode.

Another advantage of this embodiment is that the CMOSTFT driver circuitry can be enhanced in performance as well as in equalization of transistor characteristics between PMOSTFTs and NMOSTFTs, by use of the CMOSTFT structure of FIG. 14B.

EXAMPLE 13

The fabrication method shown in FIGS. 4A-4E may be modified in formation of the gate insulating film as follows. After manufacture of the mono-domain crystalline silicon film 111 of FIG. 2C, a TFT active layer is then formed by selectively using the mono-domain region only. A dielectric thin film containing silicon as its major component—here, silicon oxide—is deposited on the active layer by vapor-phase method such as CVD or PVD techniques to a predetermined thickness of 20 to 150 nm, preferably 80 nm. The thickness of such silicon oxide may be suitably designed in view of the dielectric withstanding characteristics as finally required. The silicon oxide may be replaced with other equivalent materials including silicon oxide/nitride, silicon nitride, and others.

After completion of the silicon oxide film, the resultant structure is again subject to heating in the atmosphere containing halogen elements. This heating is called the "third heat treatment" hereinafter. The third heat treatment is similar in condition to the prior second heat treatment as executed in the embodiment of FIGS. 1A-2C.

During this third heat treatment, the metallic element such as nickel which remains within the active layer is further reduced in content improving the crystallinity of the mono-domain region accordingly. During this process the thermal oxidation reaction progresses at the interface between the active layer and silicon oxide film forming a thermal oxide film of 20-nm thick. In this case it will be recommendable that the final thickness of active layer fall within a range of from 20 to 30 nm, preferably at 25 nm. This may advantageously serve to reduce or minimize the turn-off current in magnitude.

After completion of the third heat treatment, the resultant structure is subjected to a still further heat treatment at 950° C. for one hour in the atmosphere of nitride gas, for curing any possible heat damage of the thermal oxide and silicon oxide films to improve the film quality. Furthermore, as a result of the heat treatment in the atmosphere containing halogen, the halogen can reside at an increased concentration near the interface between the active layer and an overlying gate insulating film. It is shown by our SIMS experimentation that the concentration of halogen ranges from $1 \times 10^{19}$ to $1 \times 10^{20}$ atoms/cm$^3$. The thermal oxide film as formed at the interface between the active layer and silicon oxide will be used to constitute the gate insulating film along with the silicon oxide film. Any defective levels and interlattice silicon atoms are reduced during formation of the thermal oxide film, enhancing the resulting interface state between the active layer and the gate insulating film. As has been described in connection with the embodiment of FIGS. 1A-2C, the active layer offers a maximized flatness on its top surface; accordingly, the thermal oxidation reaction progresses regularly rendering the gate insulating film uniform in thickness. This improves the interface state while enhancing the withstanding or breakdown voltage characteristics of the gate insulating film.

An advantage of this embodiment is that the content of the metallic element such as Ni can be reduced in the active layer while rendering the interface excellent in state between the active layer and its overlying gate insulating film. This leads to the capability of providing semiconductor devices with electrical characteristics and reliability enhanced. Optionally, the second heat treatment of the embodiment shown in FIGS. 1A-2C and the third heat treatment of this embodiment may be done simultaneously. To do this, the crystalline silicon film 109 of FIG. 1F, which is prior to execution of the first heat treatment, is patterned forming the active layer which is then subject to the prescribed process of this embodiment.

EXAMPLE 14

One possible modification of the active-matrix LCD device using a combination of the semiconductor device shown in FIG. 4E and CMOS structure of FIG. 14B is as follows. This example is a modification of Example 2, aimed at an improvement in the interface state between the active layer and gate insulating film.

After manufacture of the mono-domain crystalline silicon film 111 of FIG. 2C, a TFT active layer is then formed by selectively using the mono-domain region only. A silicon oxide film is deposited on the active layer by vapor-phase method such as CVD or PVD techniques to a predetermined thickness of 20 to 150 nm.

After completion of the silicon oxide film, resultant structure is heated at temperatures of 500 to 700° C. (preferably, 640 to 650° C.). The temperature range is determined to be near the lower limit temperature for intended thermal oxidation. The heat treatment may be done in certain atmosphere exclusively containing oxygen or containing halogen. Alternatively, wet atmosphere containing moisture vapor may be used. The heat treatment is carried out for 0.5 to 2 hours forming a thermal oxide film to a target thickness, for example, several nanometers; typically, 1 to 9 nm. The growth of such thermal oxide will be completed when its thickness becomes equivalent thereto.

An advantage of this approach is that good inference state can be obtained between the active layer and gate insulating film, by reducing or removing residual fixed charge or defective levels at or near the polar interface. The reduction or absence of such defects is attained by thermally oxidizing only a limited shallow region of the top surface section of active layer, which region is 1 to 3 nm in depth or thickness. In other words, with this embodiment, excellent interface state can be accomplished by specifically forming a very thin thermal oxide film being limited in thickness. The oxidation here may refer to rendering the active layer thinner by 1 to 3 nm while forming thereon a new thermal oxide film of 2 to 6 nm thick. One possible explanation for the capability of obtaining such good interface is that the presence of undesirable residual fixed charge and/or crystal defects tend to concentrate exclusively in the above-identified shallow surface region of the active layer which falls within a narrow region of 1 to 3 nm spanning the active layer and gate insulating film with the interface being as a center; therefore, by removing and replacing the shallow surface region with the thermal oxide, it becomes possible to avoid inclusion of such defects almost completely.

Another advantage of this approach is that the manufacture of semiconductor devices can be improved in efficiency—namely, throughput—due to the fact that the thermal oxidation process used herein can be performed at relatively lower temperatures, reducing duty of equipment as employed therefor.

EXAMPLE 15

Turning now to FIGS. 19A to 19D, there is shown a TFT fabrication process in accordance with a further embodiment of the invention, which employs polycrystalline silicon (polysilicon) film as the gate electrode of a TFT under manufacture.

Figure 19A:
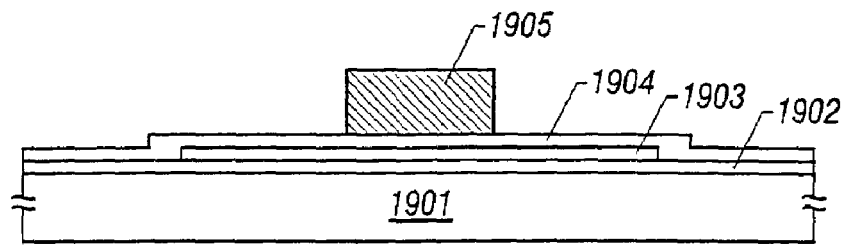
FIGS. 19A to 19D illustrate in schematic cross-section some of the major steps in the formation of a semiconductor device in accordance with a further embodiment of the invention.

In FIG. 19A, an insulating substrate 1901 is prepared which may be made of glass. The glass substrate 1901 has a top surface on which there are sequentially formed a primary coat film 1902, a patterned mono-domain crystalline active layer 1903, a gate insulating film 1904, and a patterned gate electrode 1905. Active layer 1903 is fabricated using the embodiment process as previously discussed in connection with FIGS. 1A-2C. Gate 1905 is made of polysilicon.

Figure 19B:
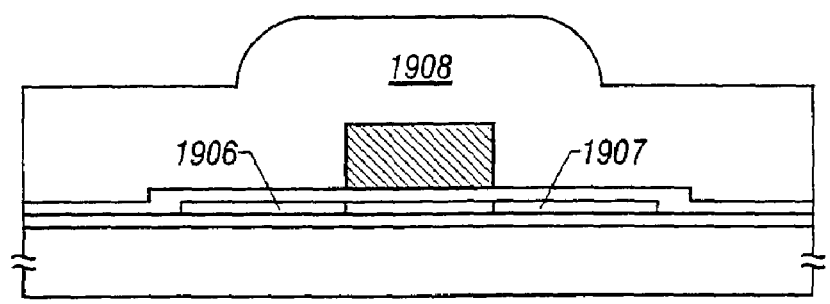

The structure of FIG. 19A is then doped with an impurity by ion implantation techniques so that spaced-apart doped regions 1906, 1907 are defined in active layer 1903 in such a manner that these are self-aligned with the overlying gate 1905 as shown in FIG. 19B. Then, a silicon nitride film 1908 is deposited to a thickness of 0.5 to 1 μm, by low pressure CVD, plasma CVD or sputter techniques, on the resultant structure. Film 1908 may alternatively be made of silicon oxide.

Figure 19C:
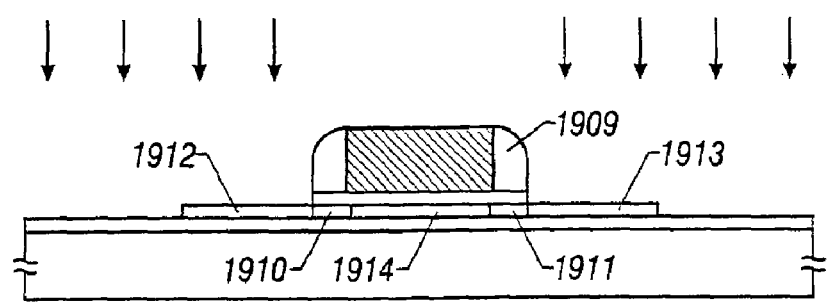

Then, the structure of FIG. 19B is subject to etch-back process to selectively etch the overlying film 1908 causing only parts of it to reside on the opposite side walls of gate 1905 as shown in FIG. 19C. These side-wall insulators are designated by numeral 1909 herein. During the etching, the gate insulating film 1904 is also etched away, and most of it other than certain part underlying a mask consisting of gate electrode 1905 and side-wall insulators 1909 is removed away.

Next, the structure of FIG. 19C is again doped with a chosen impurity by ion implantation. The charge dose here is greater than that at the prior step of impurity ion implantation. During the second ion implantation certain regions 1910, 1911 just beneath side-wall insulators 1909 are kept unchanged in impurity concentration due to the fact that no impurity is implanted thereinto. The remaining, exposed regions 1912, 1913 of active layer 1903 are further doped with impurity ions to increase the concentration of doped impurity therein. Through the first and second ion implantation steps, active layer 1903 comes to have heavily-doped source and drain regions 1912, 1913 as well as lightly-doped LDD regions 1910, 1911 laid just beneath side-wall insulators 1909. Active layer 1903 also has a non-doped intermediate region 1914, which is just beneath gate 1905 and will act as a channel formation region in resultant TFT.

Figure 19D:
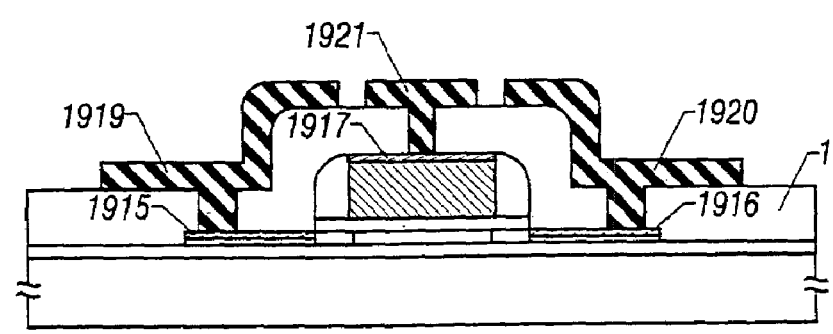

A titanium film (not shown) of 30 nm thick is formed on the structure of FIG. 19C, causing it to chemically react with the silicon film. After the titanium film is removed, resultant structure is heated by lamp anneal techniques to form titanium-silicide films 1915-1917 on the exposed surface areas of source 1912, drain 1913 and gate 1905 as shown in FIG. 19D. The titanium film may be replaced with any one of tantalum, tungsten and molybdenum films. Then, a silicon oxide film 1918 is deposited as the interlayer insulator to a thickness of 500 nm; next, several types of suitably patterned chip leads 1919-1921 for electrical interconnection of source 1912, drain 1913 and gate 1905 are formed thus completing a TFT structure shown in FIG. 19D.

An advantage of this approach is that good ohmic contacts can be attained in the TFT structure because of the fact that electrical interconnection between the TFT and chip leads are made via titanium-silicide films 1915-1917.

EXAMPLE 16

Any one of the foregoing TFTs embodying the invention may be applicable to a wide variety of types of semiconductor devices, including electrooptical display panels such as active-matrix LCD, EL or EC devices; memory devices such as DRAMs, SRAMs, VRAMs, SDRAMs, ROMs, PROMs, EEPROMs, Flash EEPROMs, NAND/NOR EEPROMs or the like; and any other equivalents which will be employed for advanced electronic apparatus or systems, such as TV cameras, head-mount display modules, motor vehicle navigation systems, front- or rear-projection display units, home-use video cameras, personal computers and others.

Figure 20A:
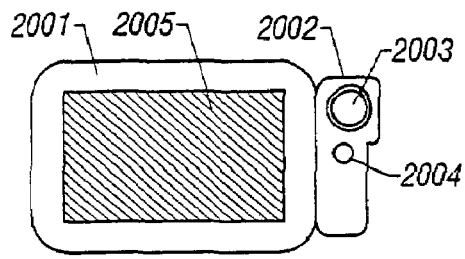
FIGS. 20A to 20F show several exemplary electronic devices to which the semiconductor device of the invention is preferably applicable.

See FIG. 20A; which depicts a mobile computer. This computer is generally structured from a main body 2001, a tuner section 2002, a display unit 2003, a control switch 2004, and a display unit 2005. The TFT of the present invention may be applied to ICs being assembled in display unit 2005 and main body.

Figure 20B:
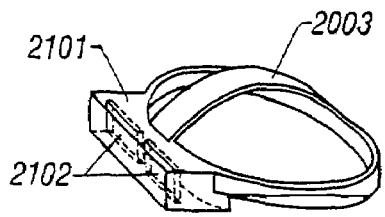

A head-mount display is shown in FIG. 20B. This display is generally structured from a main body 2101, a display unit 2102, and a band section 2103. The display unit 2102 includes a pair of relatively small-size display panels.

Figure 20C:
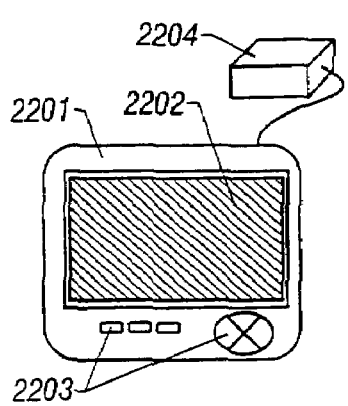

A motor vehicle navigation apparatus is shown in FIG. 20C. As shown, this apparatus includes a main body 2201, a display unit 2202, control switches 2203, and antenna 2204. The semiconductor device of the instant invention may be applied as ICs for use in display unit 2201 and internal as built-in electronics. The display unit 2202 acts as a monitor for purposes of visual indication of road map images thereon; accordingly, this may be relatively extensive in allowable range of resolution.

Figure 20D:
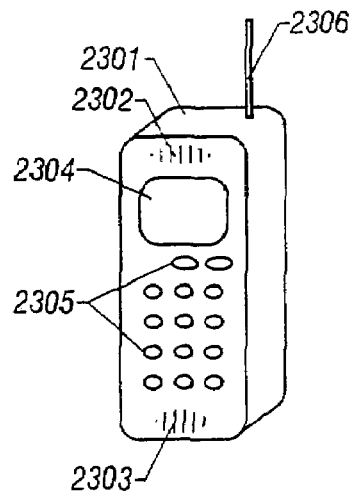

A portable or handheld mobile telephony is shown in FIG. 20D, which comes with a main body 2301, an audio output section 2302, an audio input section 2303, a display unit 2304, control switches 2305, and an antenna 2306. The semiconductor device of the instant invention may be applied as ICs for use in display unit 2301 and built-in electronics.

Figure 20E:
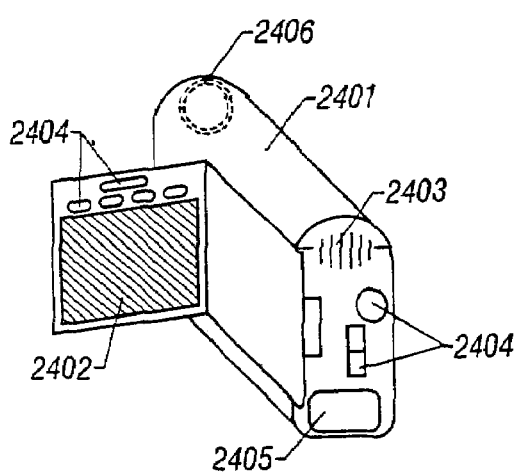

A video camera is shown in FIG. 20E, which includes a main body 2401, a display unit 2402, an audio input section 2403, control switches 2404, a battery pack 2405, and a picture receiver 2406. The semiconductor device of the invention may be applied as ICs for use in display unit 2402 and built-in electronics.

Figure 20F:
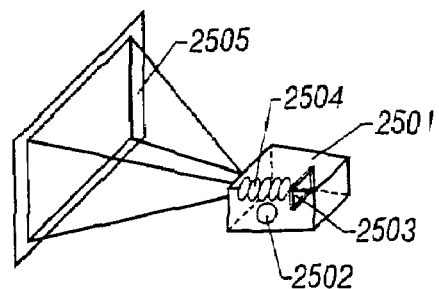

A front projection apparatus is shown in FIG. 20F, which may be constituted from a main body 2501, a light source 2502, a reflection type display unit 2503, an optical system 2504 (including known beam-splitters, optical polarizers and the like), and an associated screen 2505. The screen 2505 is a large-size one adaptable for use in presentations for the meetings and academic conferences; it is thus required that the display unit 2503 be high in resolution.

The semiconductor device of the invention will also be applicable to any types of electrooptical modules or apparatus other than the illustrative ones, including rear-projection systems, portable electronic intelligent tools such as handy terminals. As is apparent from the foregoing, the present invention may offer increased applicability, covering almost all of the currently available electronic display systems.

It has been described that the present invention may enable formation or fabrication of enlarged mono-domain regions with enhanced grain size-controllability by intentionally forming a cite acting as a crystal nucleus or seed for crystal growth while performing the heat treatments in the atmosphere containing halogen. With such an arrangement, it is possible to form an intended mono-domain region or regions on a substrate having a dielectric surface, which regions can be substantially identical in crystal structure to single-crystalline materials. This in turn enables achievement of a superior active layer of semiconductor devices such as TFTs by use of crystalline silicon films having the crystallinity equivalent to single-crystals. This makes it possible to constitute semiconductor circuitry with enhanced performance equivalent to that of ICs as manufactured using known single-crystalline wafers.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An SRAM comprising:
a substrate;
an insulating film formed on the substrate, said insulating film having a protrusion;
a pair of cross-coupled driver transistors formed over the substrate;
a pair of access transistors;
a pair of bit lines electrically connected to the cross-coupled driver transistors through the access transistors, respectively; and
a word line electrically connected to the pair of access transistors,
wherein at least one of the access transistors comprises a crystalline semiconductor film formed on the insulating film, said crystalline semiconductor film having a mono-domain region in which a channel formation region is formed, and wherein said crystalline semiconductor film comprises a source region and a drain region, and a metallic silicide is formed on the surface of said source region and said drain region.

2. The SRAM according to claim 1 wherein said mono-domain region includes substantially no grain boundary.

3. The SRAM according to claim 1 wherein any grain boundary included in said mono-domain region is electrically inactive.

4. An electronic apparatus comprising the SRAM according to claim 1, wherein the electronic apparatus is selected from the group consisting of a head-mount display, a motor vehicle navigation, a mobile phone, a video camera, a projector, and a mobile computer, wherein the electronic apparatus.

5. An SRAM comprising:
a substrate;
an insulating film formed on the substrate, said insulating film having a protrusion extending in one direction;
a pair of cross-coupled driver transistors formed over the substrate;
a pair of access transistors;
a pair of bit lines electrically connected to the cross-coupled driver transistors through the access transistors, respectively; and
a word line electrically connected to the pair of access transistors,
wherein at least one of the cross-coupled driver transistors comprises a crystalline semiconductor film formed on the insulating film, said crystalline semiconductor film having a mono-domain region in which a channel formation region is formed, and
wherein said crystalline semiconductor film comprises a source region and a drain region, and a metallic silicide is formed on the surface of said source region and said drain region.

6. The SRAM according to claim 5 wherein said mono-domain region includes substantially no grain boundary.

7. The SRAM according to claim 5 wherein any grain boundary included in said mono-domain region is electrically inactive.

8. An electronic apparatus comprising the SRAM according to claim 5, wherein the electronic apparatus is selected from the group consisting of a head-mount display, a motor vehicle navigation, a mobile phone, a video camera, a projector, and a mobile computer, wherein the electronic apparatus.

9. An SRAM comprising:
a substrate;
an insulating film formed on the substrate, said insulating film having a protrusion extending in one direction;
a pair of cross-coupled driver transistors formed over the substrate;
a pair of access transistors;
a pair of bit lines electrically connected to the cross-coupled driver transistors through the access transistors, respectively; and
a word line electrically connected to the pair of access transistors,
wherein at least one of the access transistors comprises a crystalline semiconductor film formed on the insulating film, said crystalline semiconductor film having a mono-domain region in which a channel formation region is formed, and
wherein said crystalline semiconductor film comprises a source region and a drain region, and a metallic silicide is formed on the surface of said source region and said drain region.

10. The SRAM according to claim 9 wherein said mono-domain region includes substantially no grain boundary.

11. The SRAM according to claim 9 wherein any grain boundary included in said mono-domain region is electrically inactive.

12. An electronic apparatus comprising the SRAM according to claim 9, wherein the electronic apparatus is selected from the group consisting of a head-mount display, a motor vehicle navigation, a mobile phone, a video camera, a projector, and a mobile computer, wherein the electronic apparatus.

13. An SRAM comprising:
a first layer comprising at least one first transistor and an insulating film formed over the first transistor;
a second layer on the first insulating film;
wherein the second layer comprises:
a pair of cross-coupled driver transistors;
a pair of access transistors;
a pair of bit lines electrically connected to the cross-coupled driver transistors through the access transistors, respectively; and
a word line electrically connected to the pair of access transistors,
wherein at least one of the access transistors comprises a crystalline semiconductor film formed on the insulating film, said crystalline semiconductor film having a mono-domain region in which a channel formation region is formed, and
wherein said crystalline semiconductor film comprises a source region and a drain region.

14. The SRAM according to claim 13 wherein said mono-domain region includes substantially no grain boundary.

15. The SRAM according to claim 13 wherein any grain boundary included in said mono-domain region is electrically inactive.

16. An electronic apparatus comprising the SRAM according to claim 13, wherein the electronic apparatus is selected from the group consisting of a head-mount display, a motor vehicle navigation, a mobile phone, a video camera, a projector, and a mobile computer, wherein the electronic apparatus.

17. An SRAM comprising:
a first layer comprising at least one first transistor and an insulating film formed over the first transistor;
a second layer on the first insulating film;
wherein the second layer comprises:
a pair of cross-coupled driver transistors;
a pair of access transistors;
a pair of bit lines electrically connected to the cross-coupled driver transistors through the access transistors, respectively; and
a word line electrically connected to the pair of access transistors,
wherein at least one of the cross-coupled driver transistors comprises a crystalline semiconductor film formed on the insulating film, said crystalline semiconductor film having a mono-domain region in which a channel formation region is formed, and
wherein said crystalline semiconductor film comprises a source region and a drain region.

18. The SRAM according to claim 17 wherein said mono-domain region includes substantially no grain boundary.

19. The SRAM according to claim 17 wherein any grain boundary included in said mono-domain region is electrically inactive.

20. An electronic apparatus comprising the SRAM according to claim 17, wherein the electronic apparatus is selected from the group consisting of a head-mount display, a motor vehicle navigation, a mobile phone, a video camera, a projector, and a mobile computer, wherein the electronic apparatus.

21. An SRAM comprising:
a first layer comprising at least one first transistor and an insulating film formed over the first transistor;
a second layer on the first insulating film;
wherein the second layer comprises:
a pair of cross-coupled driver transistors;
a pair of access transistors;
a pair of bit lines electrically connected to the cross-coupled driver transistors through the access transistors, respectively; and
a word line electrically connected to the pair of access transistors,
wherein at least one of the access transistors comprises a crystalline semiconductor film formed on the insulating film, said crystalline semiconductor film having a mono-domain region in which a channel formation region is formed, and
wherein said crystalline semiconductor film comprises a source region and a drain region.

22. The SRAM according to claim 21 wherein said mono-domain region includes substantially no grain boundary.

23. The SRAM according to claim 21 wherein any grain boundary included in said mono-domain region is electrically inactive.

24. An electronic apparatus comprising the SRAM according to claim 21, wherein the electronic apparatus is selected from the group consisting of a head-mount display, a motor vehicle navigation, a mobile phone, a video camera, a projector, and a mobile computer, wherein the electronic apparatus.

* * * * *